(12) United States Patent
Luther et al.

(10) Patent No.: US 9,172,220 B1
(45) Date of Patent: Oct. 27, 2015

(54) CONFIGURABLE MODULAR POWER CONTROL SYSTEM

(71) Applicant: Lex Products Corporation, Shelton, CT (US)

(72) Inventors: Robert Luther, Chester, CT (US); Joshua Liposky, Shelton, CT (US)

(*) Notice: Subject to any disclaimer, the term of this patent is extended or adjusted under 35 U.S.C. 154(b) by 188 days.

(21) Appl. No.: 14/057,430

(22) Filed: Oct. 18, 2013

Related U.S. Application Data

(60) Provisional application No. 61/715,358, filed on Oct. 18, 2012.

(51) Int. Cl.
| | |
|---|---|
| H05K 5/00 | (2006.01) |
| H02B 1/56 | (2006.01) |
| H05K 7/20 | (2006.01) |
| H05K 7/14 | (2006.01) |
| H02M 7/00 | (2006.01) |
| G06F 1/16 | (2006.01) |

(52) U.S. Cl.
CPC .............. *H02B 1/565* (2013.01); *H02M 7/003* (2013.01); *H05K 5/00* (2013.01); *H05K 7/1432* (2013.01); *H05K 7/20* (2013.01)

(58) Field of Classification Search
CPC ..... H05K 7/20; H05K 7/1432; H05K 7/1457; H05K 7/20572; H05K 5/00; H02M 7/003; H02B 1/565; H02B 1/04; G06F 1/16; G06F 1/20
USPC ......... 361/601, 605, 611, 614, 622, 624, 627, 361/641, 644, 631, 657, 728, 730, 87, 93.1, 361/93.9, 103; 363/141, 144; 174/17 R, 174/17 VA, 17 CT, 50, 520, 522, 526; 307/18, 42, 43, 147, 149; 315/112, 315/114, 115, 291, 312; 312/223.1, 236
See application file for complete search history.

(56) References Cited

U.S. PATENT DOCUMENTS

| | | | | | |
|---|---|---|---|---|---|
| 3,482,433 | A | * | 12/1969 | Gladwyn | 73/37.5 |
| 3,749,981 | A | * | 7/1973 | Koltuniak et al. | 361/696 |
| 4,691,274 | A | * | 9/1987 | Matouk et al. | 363/141 |
| 4,845,380 | A | * | 7/1989 | Piegari | 307/149 |
| 4,922,407 | A | * | 5/1990 | Birk et al. | 700/16 |
| 5,289,363 | A | * | 2/1994 | Ferchau et al. | 363/141 |
| 6,269,000 | B1 | * | 7/2001 | McCarrol | 361/695 |
| 6,947,287 | B1 | * | 9/2005 | Zansky et al. | 361/731 |
| 6,999,305 | B1 | * | 2/2006 | Calcote | 361/601 |
| 7,005,996 | B2 | * | 2/2006 | Cabrera et al. | 340/639 |
| 7,613,546 | B2 | * | 11/2009 | Nelson et al. | 700/284 |
| 8,174,821 | B2 | * | 5/2012 | Fontana et al. | 361/601 |
| 8,451,590 | B2 | * | 5/2013 | Coffey et al. | 361/643 |
| 2006/0120001 | A1 | * | 6/2006 | Weber et al. | 361/103 |
| 2009/0225500 | A1 | * | 9/2009 | Cherney et al. | 361/622 |
| 2012/0127635 | A1 | * | 5/2012 | Grindeland | 361/605 |

\* cited by examiner

*Primary Examiner* — Michail V Datskovskiy
(74) *Attorney, Agent, or Firm* — Steven M. McHugh

(57) ABSTRACT

A modular power control system is provided and includes a base enclosure, wherein the base enclosure and a base enclosure door, wherein the base enclosure defines a base enclosure cavity and the base enclosure door defines a base enclosure door cavity. Additionally, a module enclosure is provided and includes a module enclosure top, a module enclosure bottom, and two module enclosure sides, wherein the module enclose defines a module enclosure cavity and a module enclosure internal support, wherein the module enclosure internal support includes a module enclosure internal support rear and two module enclosure internal support sides having a first module guide channel located on one of the two module enclosure internal support sides and a second module guide channel located on the other of the two module enclosure internal support side.

20 Claims, 24 Drawing Sheets

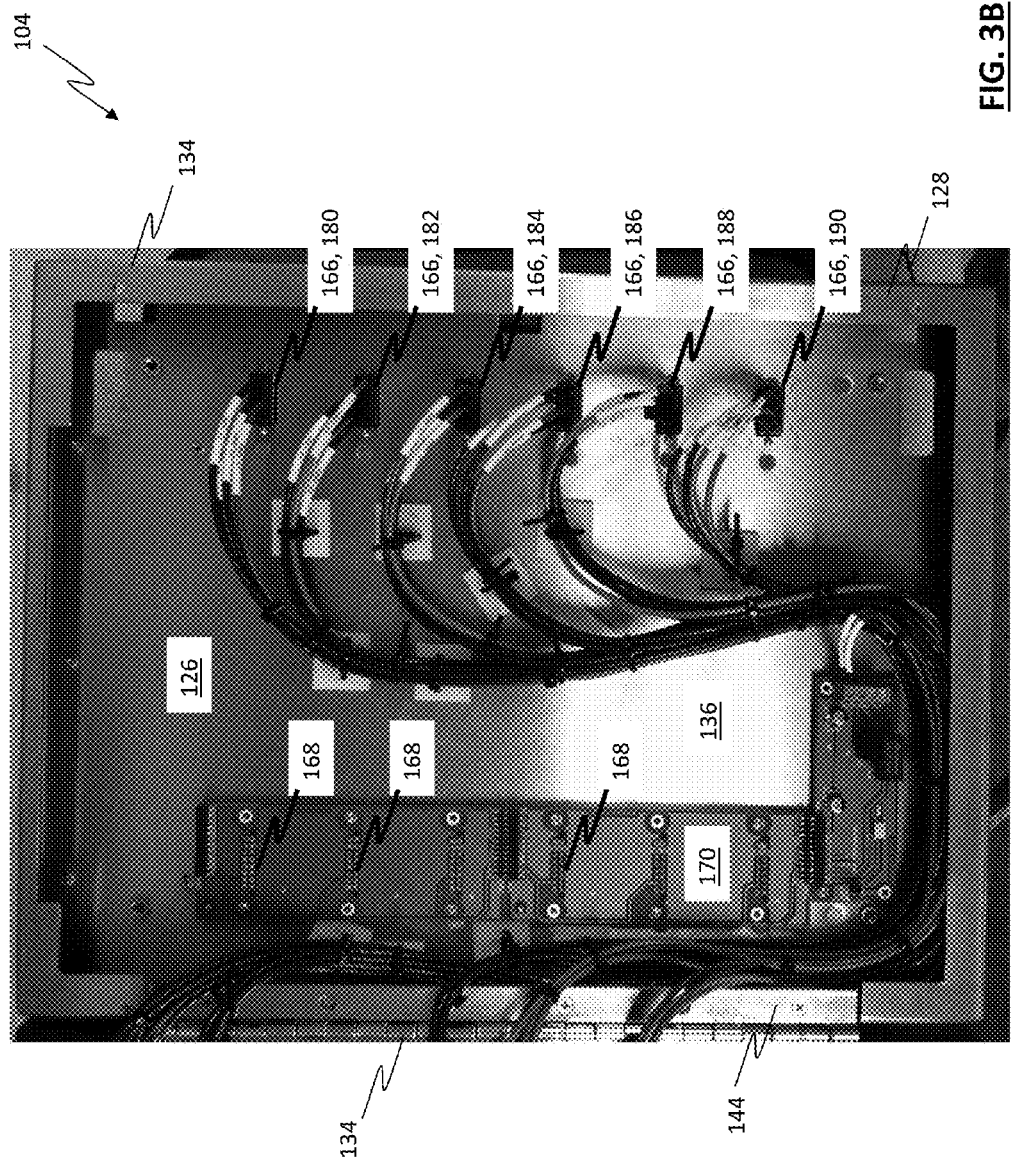

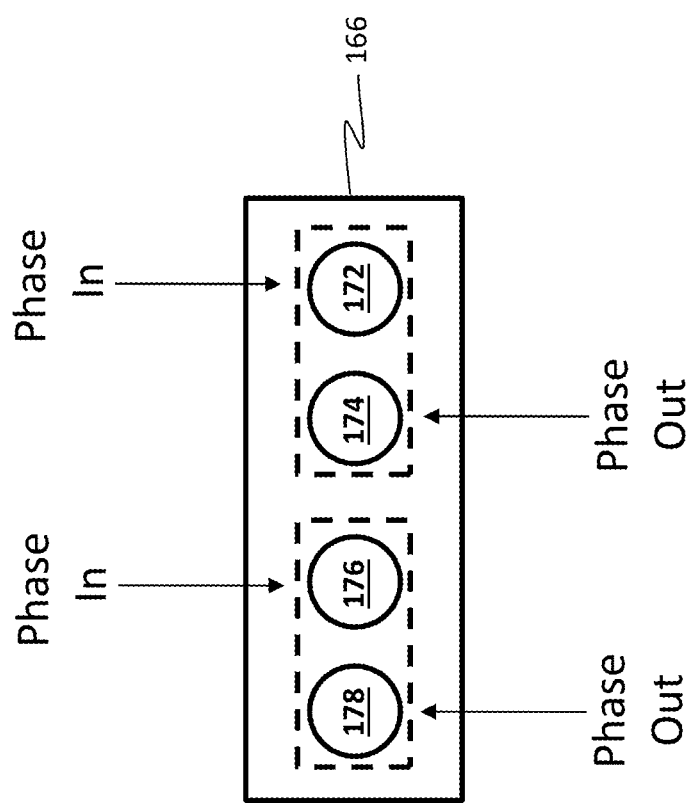

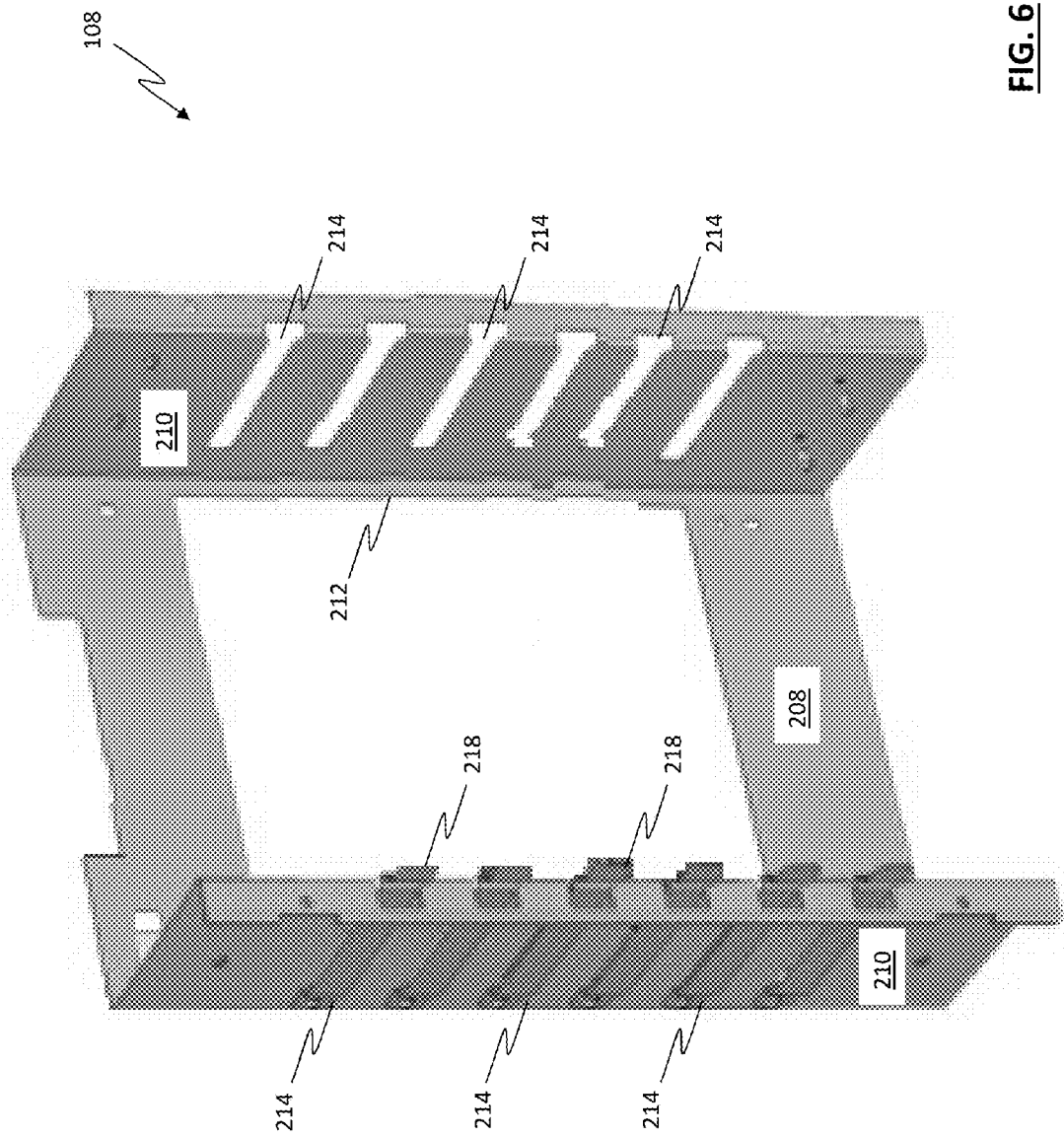

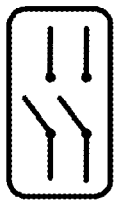
Two (2) Single-Pole 20A 120V Relays
One (1) Double-Pole 20A 220V Relay
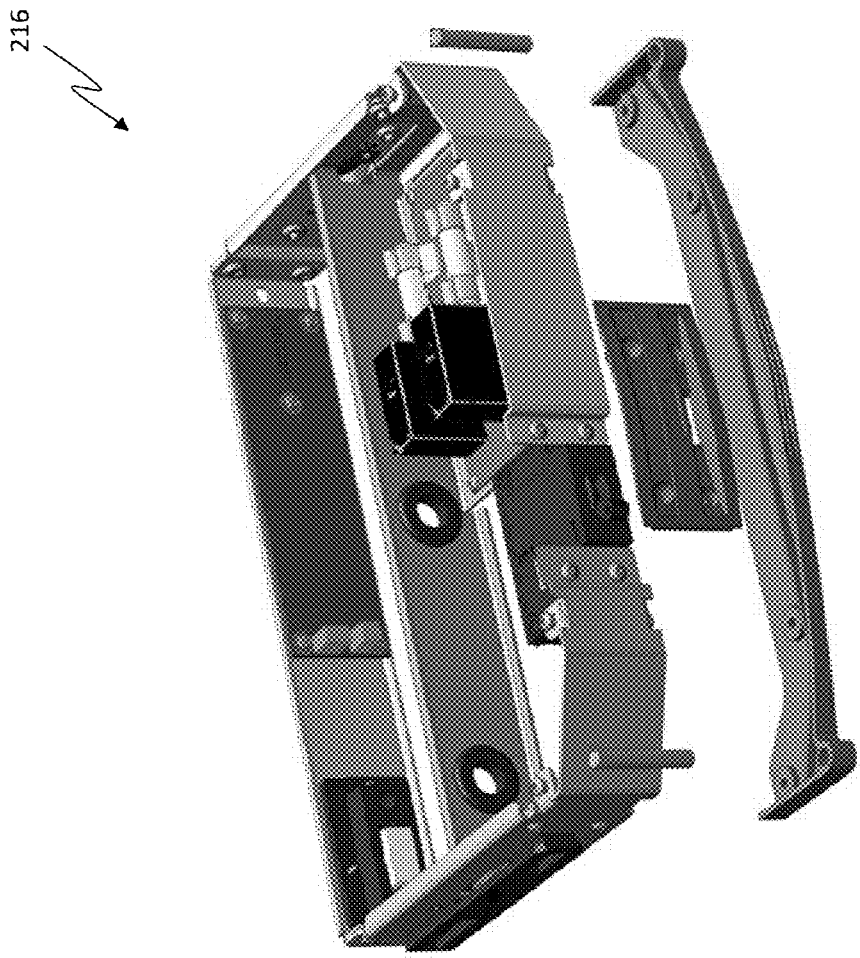
FIG. 9

| INSTALLATION PANELS | | | | |
|---|---|---|---|---|
| MODULE CAPACITY | HEIGHT | WIDTH | DEPTH | PANEL CAPACITY |
| 3 | 11.2" | 12.8" | 12.2" | 40A 3∅ 208Y/120V |
| 6 | 16.6" | 12.8" | 12.2" | 80A 3∅ 208Y/120V |
| 9 | 22.0" | 12.8" | 12.2" | 120A 3∅ 208Y/120V |
| 12 | 27.4" | 12.8" | 12.2" | 160A 3∅ 208Y/120V |
| 15 | 32.8" | 12.8" | 12.2" | 200A 3∅ 208Y/120V |

Figure 16

CONFIGURABLE MODULAR POWER CONTROL SYSTEM

RELATED APPLICATIONS

This application is related to and claims the benefit of the filing date of U.S. Provisional Patent Application Ser. No. 61/715,358, filed Oct. 18, 2012, the contents of which are incorporated by reference herein in its entirety.

FIELD OF THE INVENTION

The present invention relates generally to a system for controlling power and more particularly to a modular power control system that is configurable to accomplish various types of power control operations such as dimmer control and single-pole/double-pole relay requirements.

BACKGROUND OF THE INVENTION

Power control systems that control dimmer and power relay operations lighting and other devices are known in the art and are typically constructed using large enclosures that have exposed bus bars (one bus bar for each electrical phase) and other electrical connections. Moreover, the components used to accomplish the task of controlling dimmer and power relay functions are 'hardwired' into the enclosure and typically require a large amount of wiring which results in a virtual 'rats nest' of wires inside of the enclosure. Furthermore, as these systems deal with large power applications, the components used typically generate large amounts of heat.

Unfortunately however, current designs do little in the way of providing a safe environment for technicians that must work on these systems. The exposed bus bars and electrical connections create a safety hazard for people that have access the internal area of the enclosure. This is undesirable because electrocution and shock can not only occur when the components and bus bars are accidentally touch, but with high power devices such as relays, switches, circuit breakers, etc. if an individual gets to close an electric arc may occur. Accordingly, although a trained technician may have a reduced risk of electric shock, the exposed nature of the components and bus bars makes that risk more prevalent.

Additionally, the current enclosures are not designed to efficiently dissipate the heat generated by the components. Accordingly, the temperature within the enclosure typically rises to a high level and may result in failure of the components. This creates a tempting opportunity to leave the enclosure door open to help dissipate the heat. Unfortunately, this creates a furthermore safety hazard by allowing access into the system enclosure and exposing non-trained personnel to the electrical components within the enclosure.

SUMMARY OF THE INVENTION

A modular power control system is provided and includes a base enclosure having a base enclosure top, a base enclosure bottom, a base enclosure front, a base enclosure rear and two base enclosure sides, wherein the base enclosure defines a base enclosure cavity. The module power control system further includes a base enclosure door having a base enclosure door top, a base enclosure door bottom, a base enclosure door front, a base enclosure door rear and two base enclosure door sides, wherein the base enclosure door defines a base enclosure door cavity. Additionally, that module power control system further includes a module enclosure having a module enclosure top, a module enclosure bottom, a module enclosure sure rear and two module enclosure sides, wherein the module enclose defines a module enclosure cavity and includes at least one fan on the module enclosure bottom and at least one vent opening in the module enclosure top. The module power control system also includes a module enclosure internal support, wherein the module enclosure internal support includes a module enclosure internal support rear and two module enclosure internal support sides having a first module guide channel located on one of the two module enclosure internal support sides and a second module guide channel located on the other of the two module enclosure internal support sides and at least one module, wherein the at least one module includes a module rear, a module front and module sides which define a module cavity, wherein each of the module sides include a side channel guide for interacting with the first and second module guide channels to support the module and wherein the at least one module may include a chimney module having a substantially vacant module cavity, wherein if a chimney module is included it may be associated with the at least one fan to direct air flowing out of the fan through the chimney module cavity toward the at least one vent opening.

A modular power control system is provided and includes a base enclosure, a base enclosure door, wherein the base enclosure and base enclosure door define a cavity for containing electrical components, wherein the base enclosure door includes a plurality of base connectors which are in electrical communication with the electrical components such that each base connector is connected to a plurality of electrical power phases; a module enclosure having a module enclosure top, a module enclosure bottom and two module enclosure sides which include module guide channels, wherein the module enclose defines a module enclosure cavity and includes a fan on the module enclosure bottom and a vent opening in the module enclosure top and a module, wherein the module includes a module rear, a module front and module sides which defines a module cavity having a module electrical component, wherein each of the module sides include a side channel guide for slidingly interacting with the module guide channels to support the module within the module enclosure cavity and wherein the module rear includes a module power connector configured to mate with the base connector when the module is contained within the module cavity such that the module electrical component is connected to at least one of the plurality of electrical power phases.

A modular power control system is provided and includes a base enclosure and a base enclosure door, wherein the base enclosure and base enclosure door define a cavity for containing electrical components, wherein the base enclosure door includes a plurality of base connectors which are in electrical communication with the electrical components such that each base connector is connected to a plurality of electrical power phases. The modular power control system also includes a module enclosure having a module enclosure top, a module enclosure bottom and two module enclosure sides which include module guide channels and a module, wherein the module includes a module rear, a module front and module sides which defines a module cavity having a module electrical component, wherein each of the module sides include a side channel guide for slidingly interacting with the module guide channels to support the module within the module enclosure cavity and wherein the module rear includes a module power connector configured to mate with the base connector when the module is contained within the module cavity such that the module electrical component is in electrical communication with at least one of the plurality of electrical power phases

BRIEF DESCRIPTION OF THE DRAWINGS

The foregoing and other features and advantages of the present invention will be better understood from the following detailed description of illustrative embodiments, taken in conjunction with the accompanying drawings in which:

FIG. 3B is a rear view of the base enclosure door showing the base enclosure door cavity of the MPCS of FIG. 1.

FIG. 4A is a rear view of a power connector of the MPCS of FIG. 1 illustrating the pin configuration.

FIG. 6 is a front side isometric view of the module enclosure internal support of the MPCS of FIG. 1.

FIG. 9 is top side isometric view of a relay (single-pole/double-pole) module for use with the MPCS of FIG. 1 illustrating an 'open' design.

FIG. 16 is chart illustrating some embodiments of various sizes of the MPCS of FIG. 1.

DETAILED DESCRIPTION OF THE INVENTION

It should be appreciated that although the modular power distribution system of the present invention is described herein in terms of a dimmer array system, the concept of the invention may be used for any situation that requires power to be distributed. It should also be appreciated that the present invention may be a portable or permanently installed unit configurable for operation with single and multiple phase applications of up to 200 A (and in some cases greater than 200 A), such as power distribution application for LEDs, moving lights, traditional dimming, etc.

Figure 1:
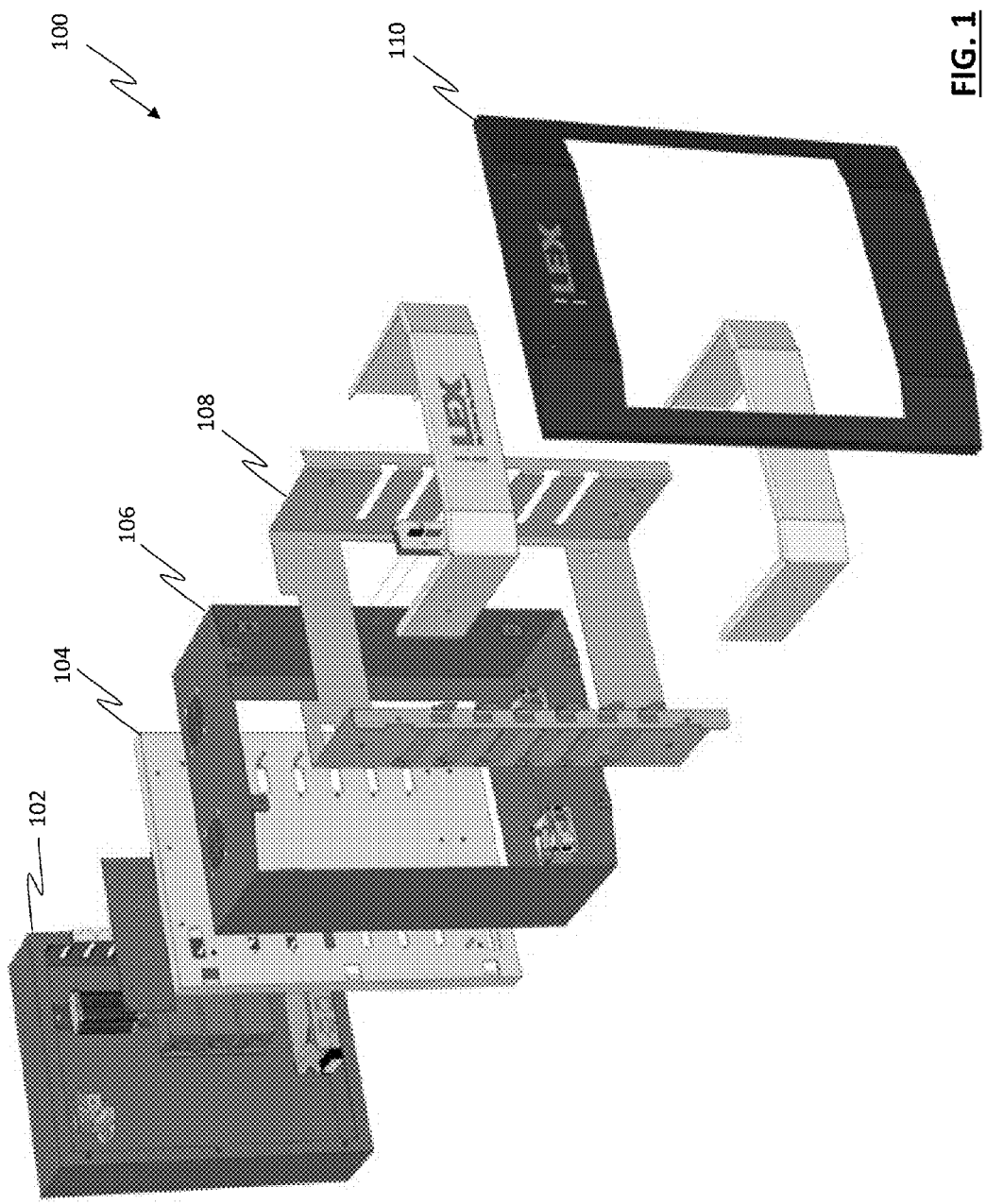
FIG. 1 is a top down perspective exploded view of a Modular Power Control System (MPCS), in accordance with one embodiment of the present invention.

Referring to FIG. 1, a Modular Power Control System (MPCS) 100 is shown and includes a base enclosure 102, a base enclosure door 104, a module enclosure 106, a module enclosure internal support 108 and a module enclosure front panel 110.

Figure 2A:
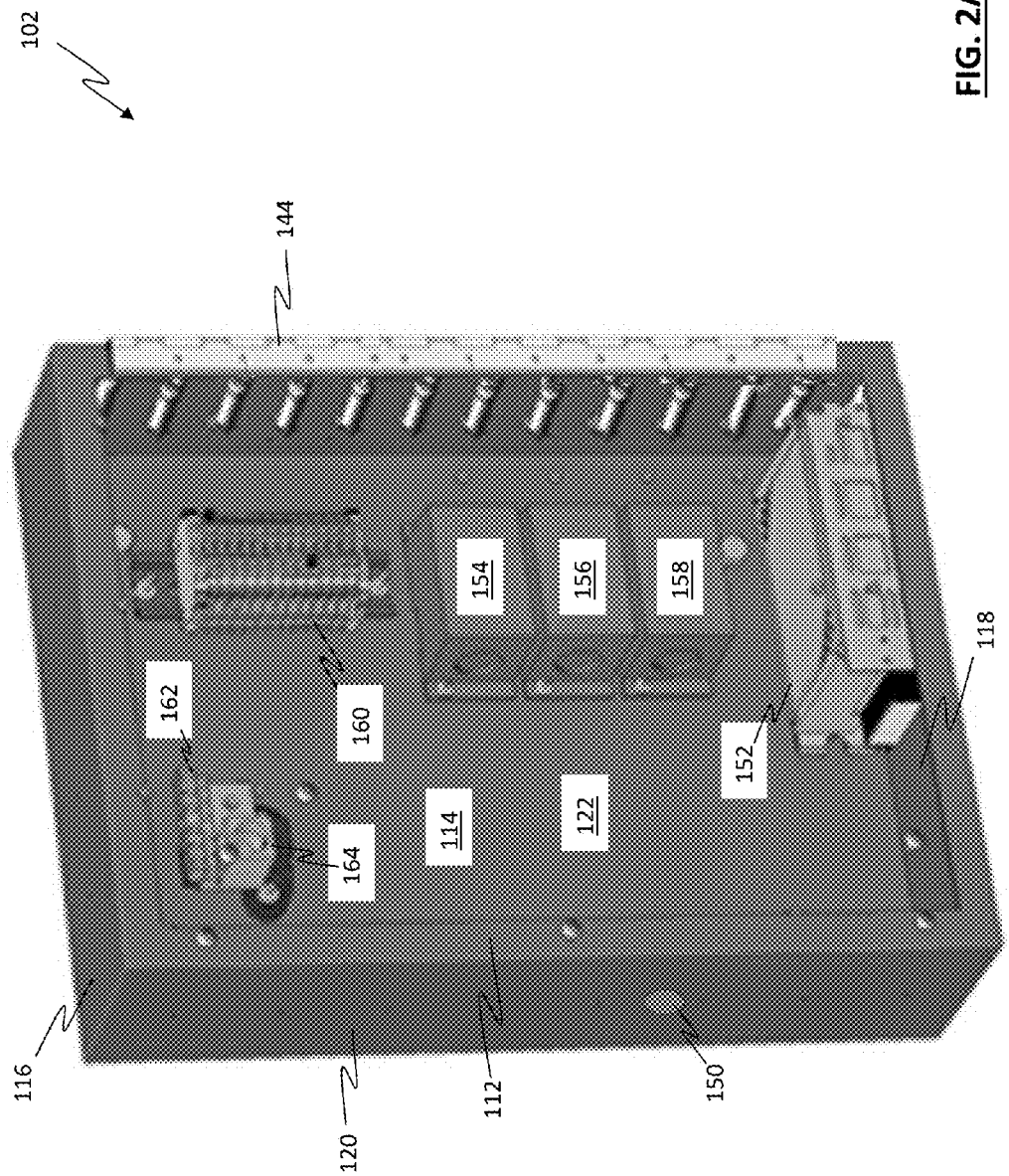
FIG. 2A is front isometric view of the base enclosure of the MPCS of FIG. 1.
Figure 2B:
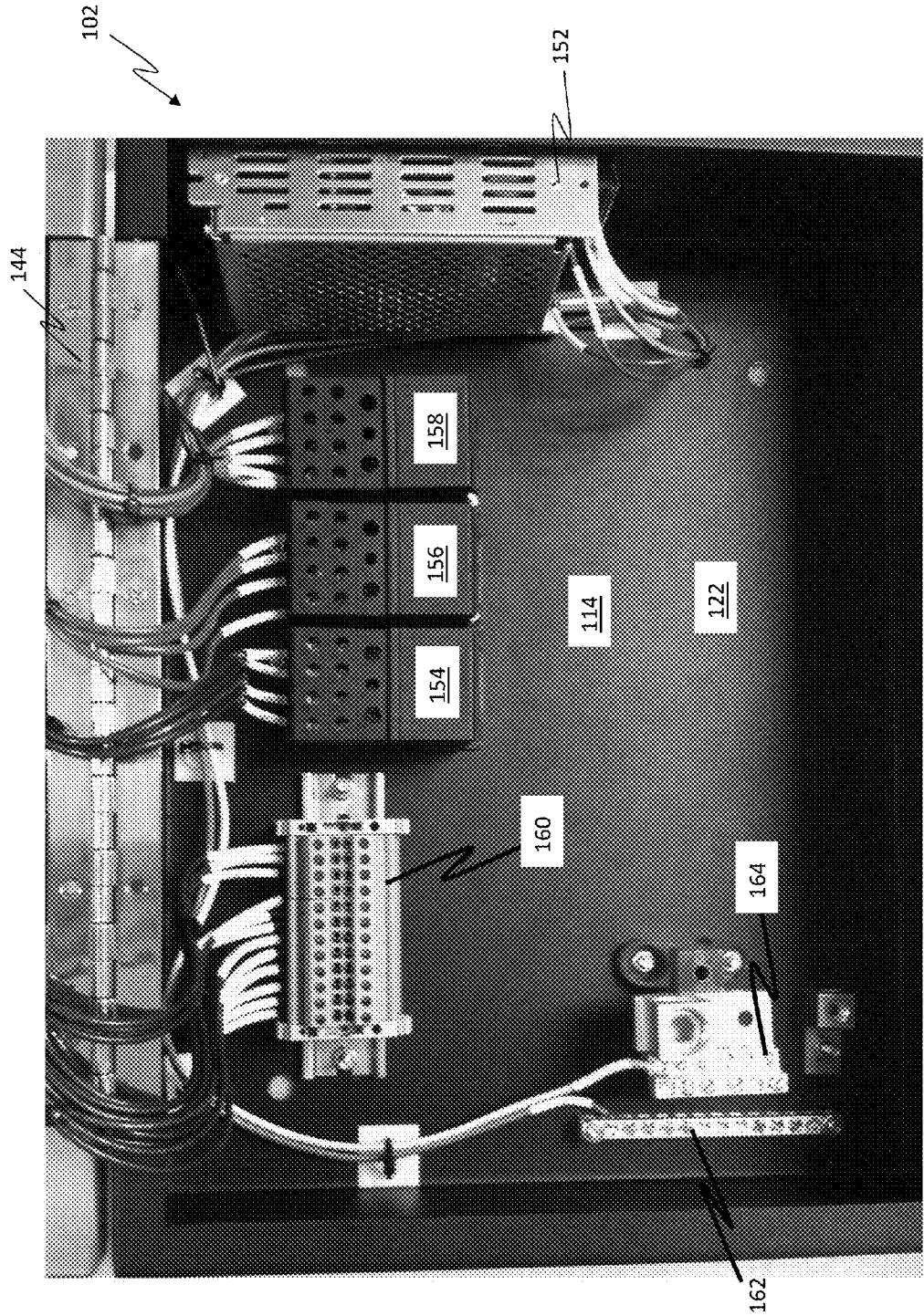
FIG. 2B is front view of the base enclosure of the MPCS of FIG. 1.
Figure 3A:
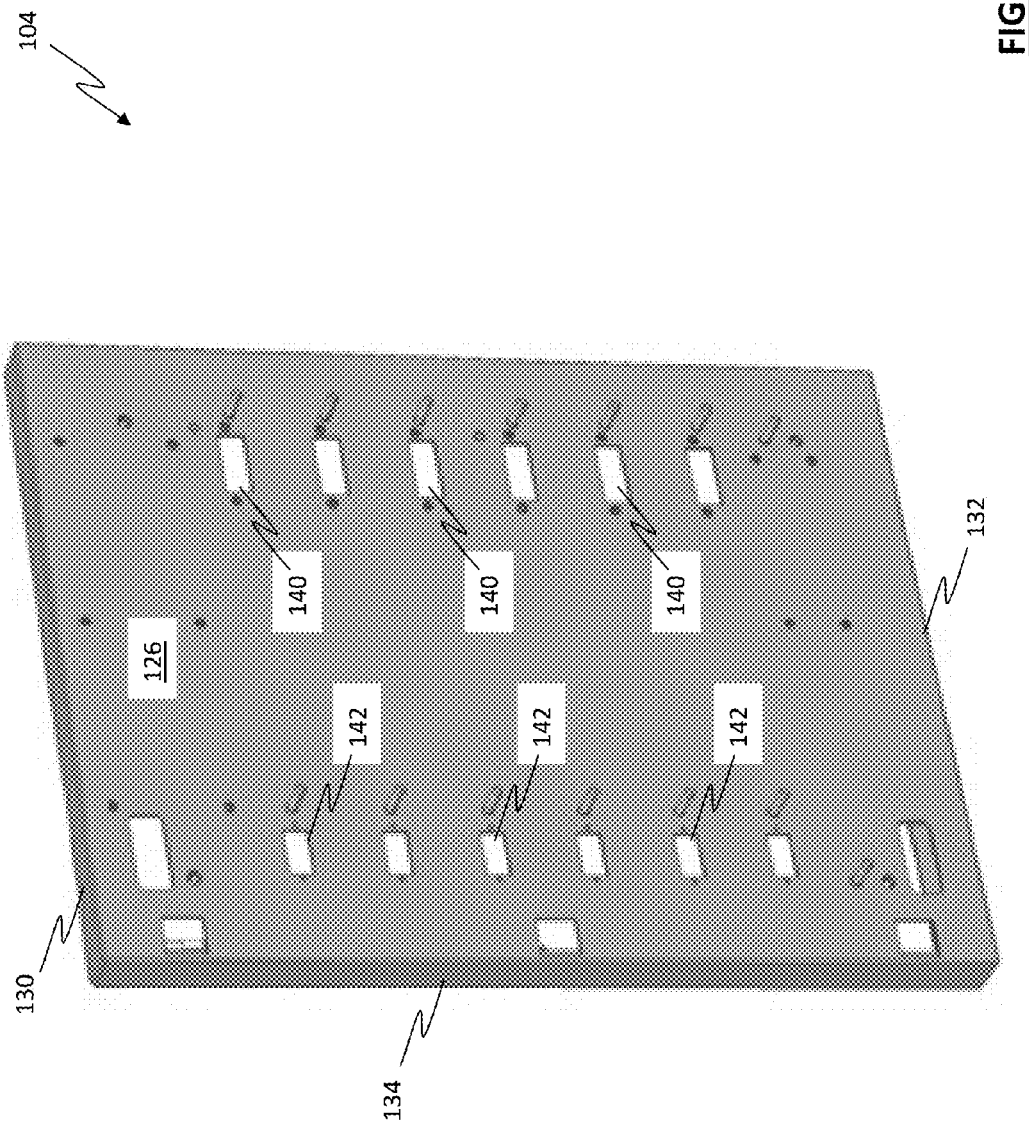
FIG. 3A is a front perspective view of the base enclosure door of the MPCS of FIG. 1.

Referring to FIG. 2A and FIG. 2B, the base enclosure 102 includes a base enclosure front 112, a base enclosure back 114, a base enclosure top 116, a base enclosure bottom 118 and two base enclosure sides 120, wherein the base enclosure front 112, base enclosure back 114, base enclosure top 116, base enclosure bottom 118 and base enclosure sides 120 define a base enclosure cavity 122. Additionally, the base enclosure front 112 includes a base enclosure opening 124 which allows access into the base enclosure cavity 122. Referring to FIG. 3A and FIG. 3B, the base enclosure door 104 includes a base enclosure door front 126, a base enclosure door back 128, a base enclosure door top 130, a base enclosure door bottom 132 and two base enclosure door sides 134, wherein the base enclosure door front 126, base enclosure door back 128, base enclosure door top 130, base enclosure door bottom 132 and base enclosure door sides 134 define a base enclosure door cavity 136. Additionally, the base enclosure door back 128 includes a base enclosure door opening 138 which allows access into the base enclosure door cavity 136. The base enclosure door also includes a plurality of power connector openings 140 and a plurality of signal connector openings 142.

It should be appreciated that the base enclosure door 104 is attached to the base enclosure 102 via a hinge 144 such that the base enclosure door 104 is rotatable between an open configuration and a closed configuration. When in the open configuration, the base enclosure cavity 122 and base enclosure door cavity 136 are accessible. When in the closed configuration, the base enclosure door back 128 aligns with the base enclosure front 112 to enclose the base enclosure cavity 122/base enclosure door cavity 136 and such that the base enclosure opening 124 and base enclosure door opening 138 are proximate each other. A base enclosure locking member may be included on at least one of the base enclosure 102 and the base enclosure door 104 to limit access to the base enclosure cavity 122 and the base enclosure door cavity 136.

Referring again to FIG. 2A and FIG. 2B, the MPCS 100 also includes a power input opening 150, a power supply 152, a Phase A power input terminal 154, a Phase B power input terminal 156, a Phase C power input terminal 158, a power output distribution block 160, a ground terminal 162 and a neutral terminal 164, wherein the power supply 152, Phase A power input terminal 154, Phase B power input terminal 156, Phase C power input terminal 158, power output distribution block 160, ground terminal 162 and neutral terminal 164 are securely located within the base enclosure cavity 122. Additionally, referring again to FIG. 3A and FIG. 3B, the MPCS 100 also includes a plurality of power connectors 166, a plurality of signal connectors 168 and PCB Backplane 170 which are located within the base enclosure door cavity 136. The plurality of power connectors 166 are associated with the plurality of power connector openings 140 and the plurality of signal connectors 168 are associated with the plurality of signal connector openings 142 such that the interface portion of the plurality of power connectors 166 and signal connectors 168 are accessible via the base enclosure door front 126. It should be appreciated that the number of power connectors 166 and signal connectors 168 may be dependent on the number of modules that the MPCS 100 can accommodate. Additionally, referring to FIG. 4A each of the power connectors 166 include a first power input port 172, a first power output port 174, a second power input port 176 and a second power output port 178.

It should be appreciated that the three-phase power is introduced into the MPCS 100 via the power input opening 150 and includes a Phase A conductor that is connected to the Phase A power input terminal 154, a Phase B conductor that is connected to the Phase B power input terminal 156 and a Phase C conductor that is connected to the Phase C power input terminal 158. The three-phase power also includes a neutral conductor that is connected to the neutral terminal 164 and a ground conductor that is connected to the ground terminal 162. Additionally, the power supply 152 may be powered via the three-phase power by connecting the power input of the power supply 152 to at least one of the Phase A power input terminal 154, Phase B power input terminal 156 or Phase C power input terminal 158.

Figure 4B:
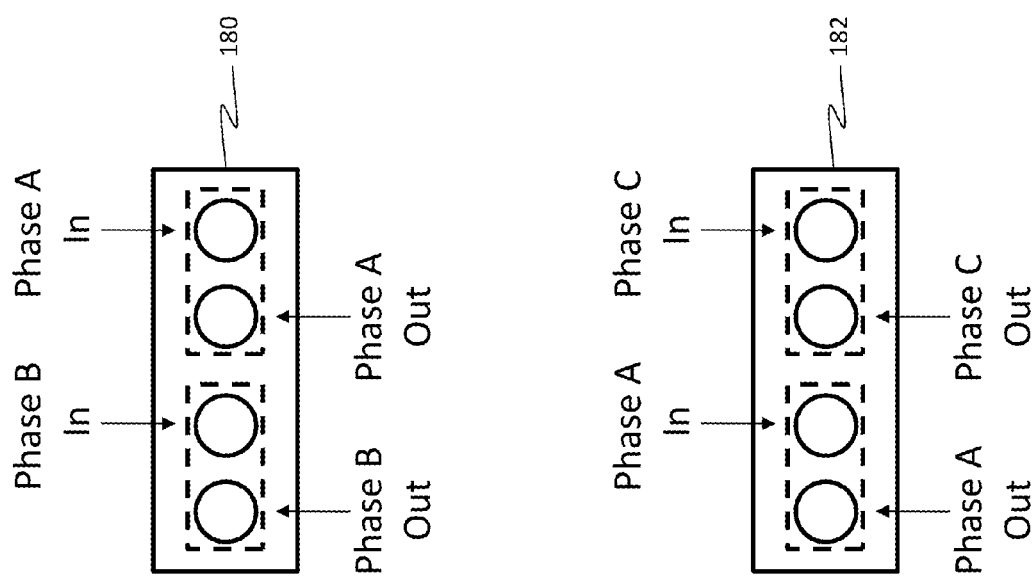
FIG. 4B is a rear view of the first and second power connectors of the MPCS of FIG. 1 illustrating the pin configuration.
Figure 4C:
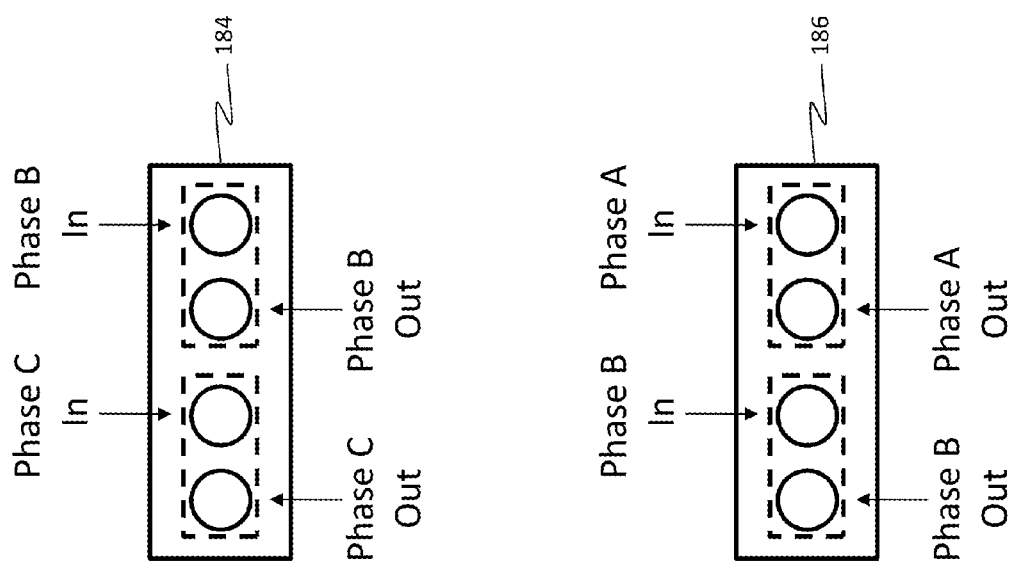
FIG. 4C is a rear view of the third and fourth power connectors of the MPCS of FIG. 1 illustrating the pin configuration.
Figure 4D:
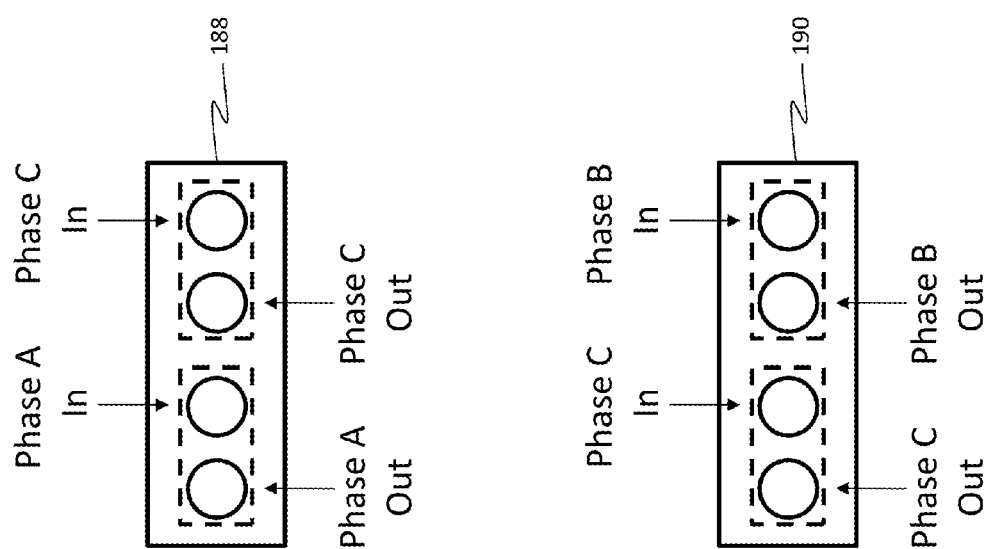
FIG. 4D is a rear view of the fifth and sixth power connectors of the MPCS of FIG. 1 illustrating the pin configuration.

Referring to FIG. 4B, FIG. 4C and FIG. 4D, one embodiment of the connection of the power phases to the plurality of power connectors 166 is illustrated. As shown, the MPCS 100 is configured to accommodate six (6) modules and thus includes a first power connector 180, a second power connector 182, a third power connector 184, a fourth power connector 186, a fifth power connector 188 and a sixth power connector 190. The first power connector 180 is configured to have a Phase A power input and output and a Phase B power input and output, the second power connector 182 is configured to have a Phase C power input and output and a Phase A power input and output, the third power connector 184 is configured to have a Phase B power input and output and a Phase C power input and output, the fourth power connector 186 is configured to have a Phase A power input and output and a Phase B power input and output, the fifth power connector 188 is configured to have a Phase C power input and output and a Phase A power input and output and the sixth power connector is configured to have a Phase B power input and output and a Phase C power input and output. It should be appreciated that the phase power inputs of the plurality of connectors 166 are connected to the appropriate Phase power input terminal and the and the phase power outputs of the plurality of connectors 166 are connected to the power output distribution block 160 for distribution to external loads. The signal connectors 168 are connected to the PCB Backplane 170. Moreover, power conductors from the power supply 152 are also connected to the PCB Backplane 170 to provide power to the PCB Backplane 170.

Figure 4E:
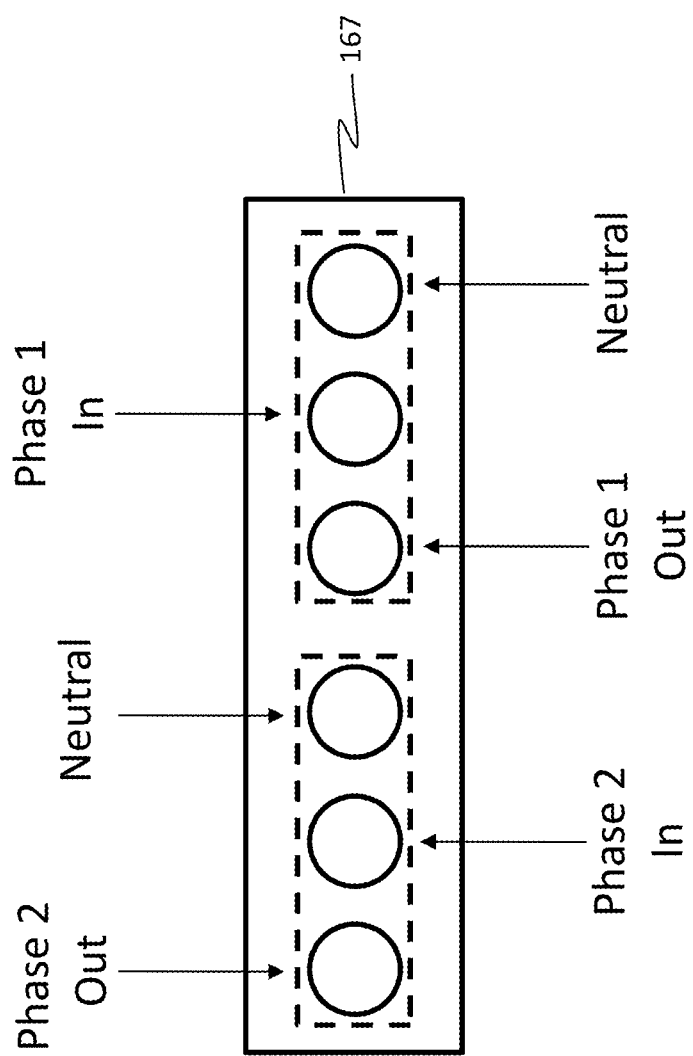
FIG. 4E is a rear view of a power connector illustrating the pin configuration in accordance with an additional embodiment.

It should be appreciated that various types of power connectors 166 may be used in response for different configurations. For example, the power connectors 166 may vary from a four (4) pin configuration (See FIG. 4A) and may include a six (6) (or more) pin connector 167 (See FIG. 4E). In this embodiment, the six (6) pin connector 167 includes pins for two phases, where each phase includes a power phase output pin, a power phase input pin and a neutral pin. Other connector configurations are also contemplated and are responsive to the application.

Figure 5:
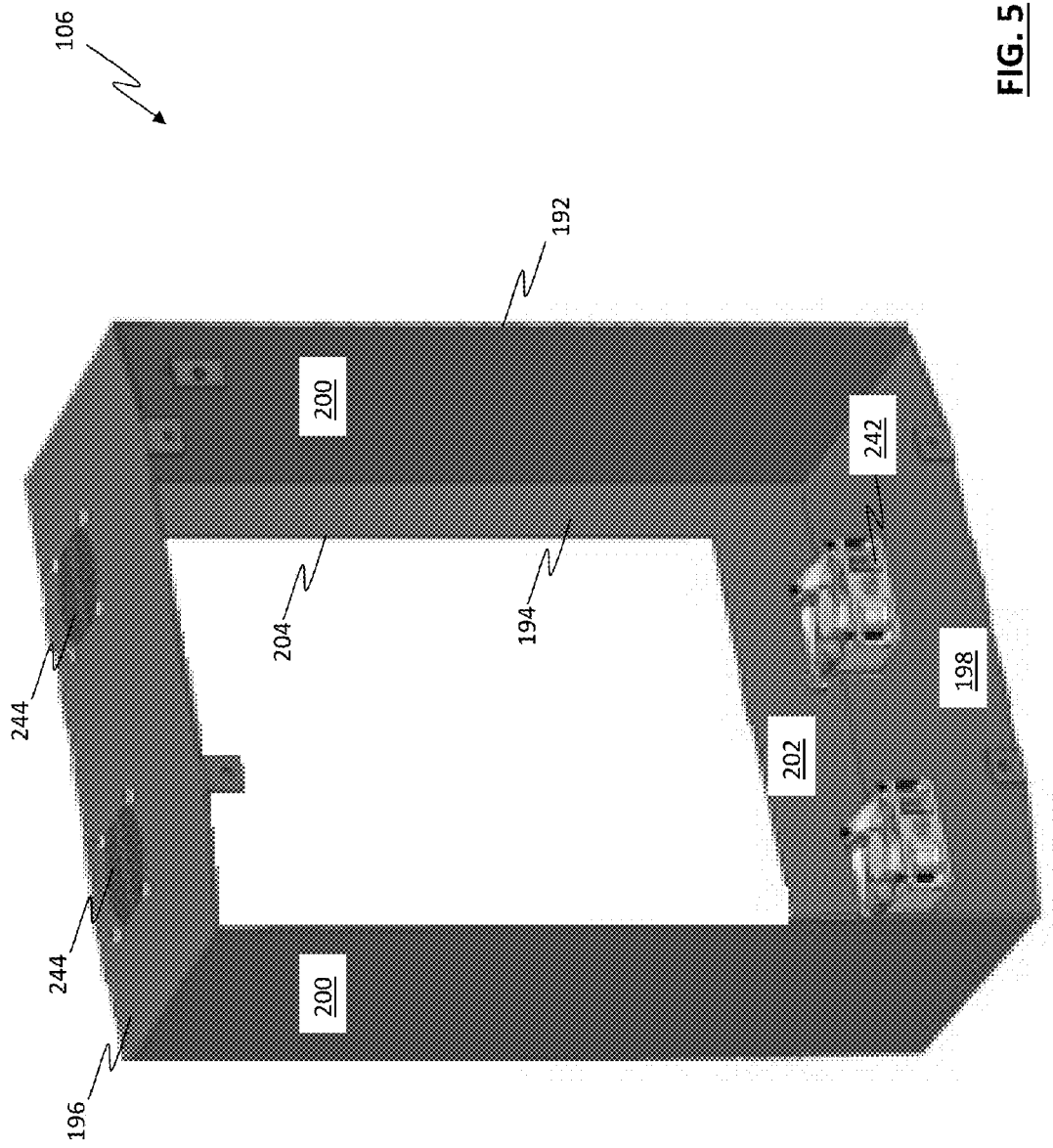
FIG. 5 is a front side isometric view of the module enclosure of the MPCS of FIG. 1.

Referring to FIG. 5, the module enclosure 106 includes a module enclosure front 192, a module enclosure rear 194, a module enclosure top 196, a module enclosure bottom 198 and two module enclosure sides 200, wherein the module enclosure rear 194, module enclosure top 196, module enclosure bottom 198 and module enclosure sides 200 define a module enclosure cavity 202. Additionally, the module enclosure rear 194 includes a module enclosure rear opening 204 and the module enclosure front 192 includes a module enclosure front opening 206 to allow access to the module enclosure cavity 202 from both the module enclosure front 192 and the module enclosure rear 194. Referring to FIG. 6, the module enclosure internal support 108 includes a module enclosure internal support rear 208 and two module enclosure internal support sides 210, where the module enclosure internal support rear 208 includes an internal support opening 212. The module enclosure internal support 108 is securely located within the module enclosure cavity 202 such that the internal support opening 212 is aligned with the module enclosure rear opening 204. It should be appreciated that the module enclosure internal support 108 is securely attached to the module enclosure rear 194 and/or the module enclosure sides 200 via screws. The module enclosure internal support 108 further includes a plurality of module guide channel pairs 214, where one of the channels of the module guide channel pair 214 is located on one side of the module enclosure internal support sides 210 and the other of the channel of the module guide channel pair 214 is located on the other side of the module enclosure internal support sides 210. These module guide channel pairs 168 are configured to slidingly receive and contain a module 216 within the module enclosure 106, where one channel of the module guide channel pairs 214 include a resilient member 218 which interacts with the module 216 as discussed further hereinafter to lockingly and securely contain the module 216 within the module guide channel pair 214.

Figure 7A:
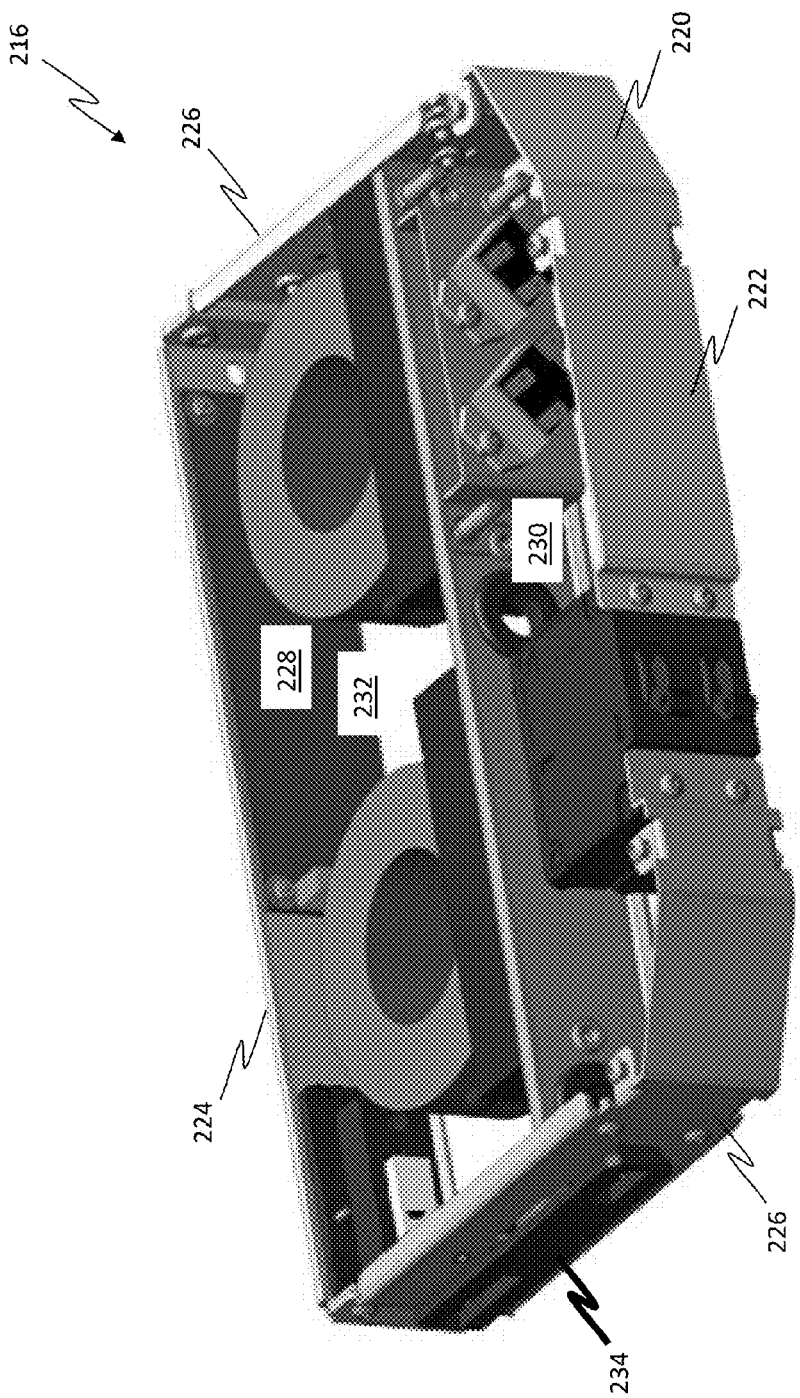
FIG. 7A is top side isometric view of one embodiment of a module for use with the MPCS of FIG. 1 illustrating an 'open' design.
Figure 7B:
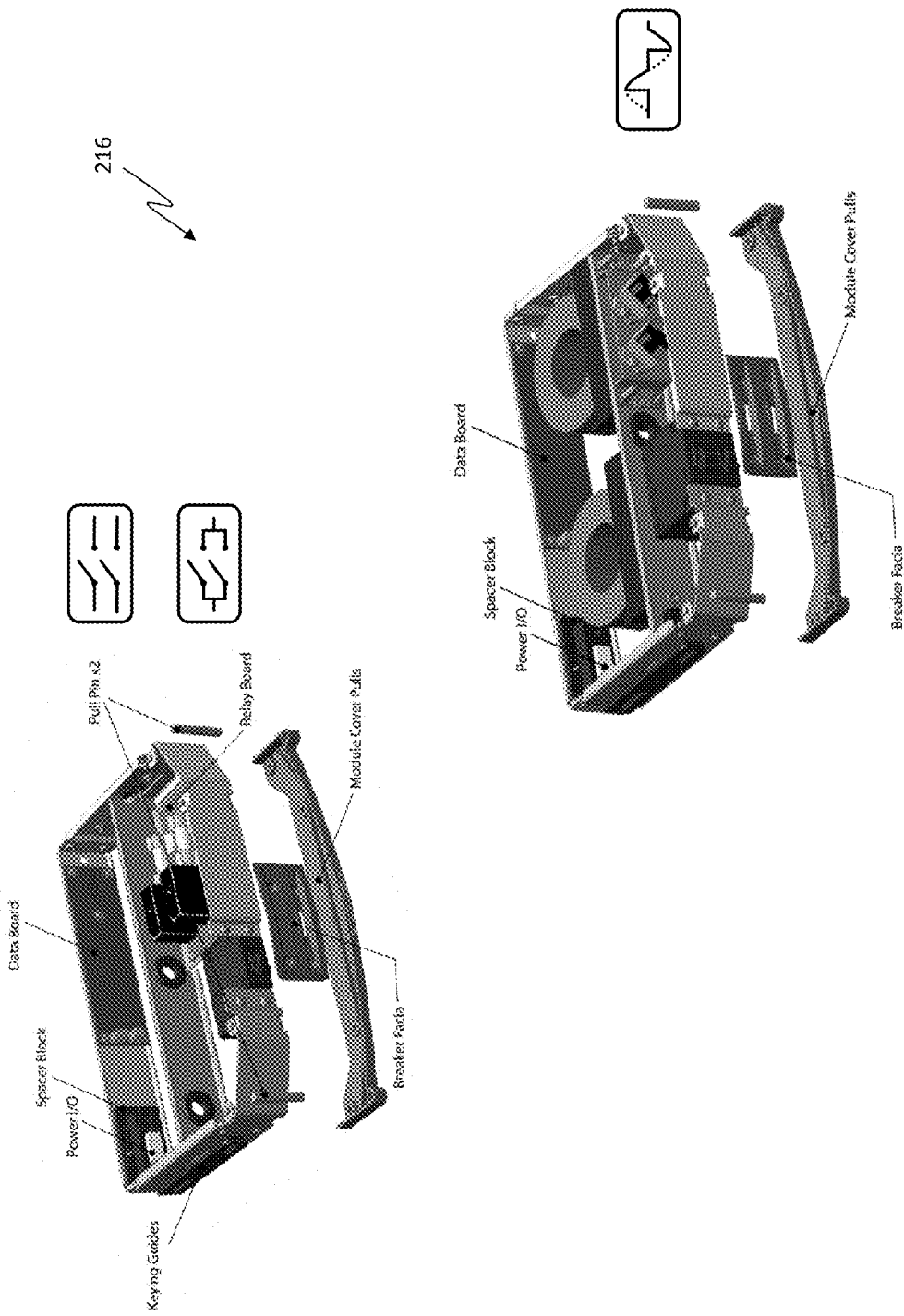
FIG. 7B is top side isometric view of multiple embodiments of modules for use with the MPCS of FIG. 1.
Figure 8:
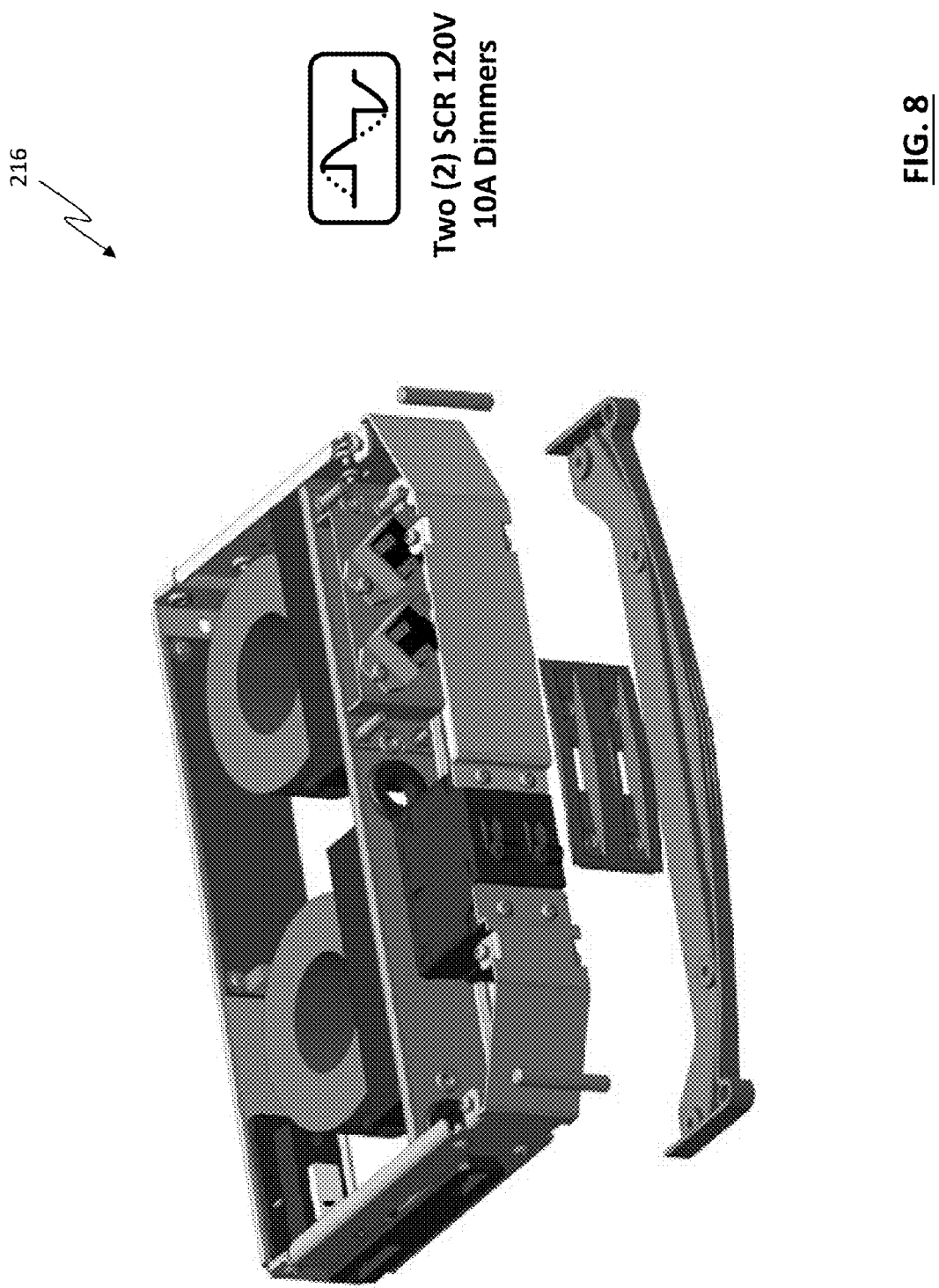
FIG. 8 is top side isometric view of a dimmer module for use with the MPCS of FIG. 1 illustrating an 'open' design.

Referring to FIG. 7A and FIG. 7B, one embodiment of the module 216 is shown and includes a module housing 220 having a module housing front 222, a module housing rear 224 and module housing sides 226, wherein the module housing front 222, module housing rear 224 and module housing sides 226 define a module housing cavity 228 for containing module components. It should be appreciated that the module components are dependent upon the function of the module 216. For example, in one embodiment referring to FIG. 8 if the module 216 is a dimmer module, then the module 216 may contain dimmer power components (such as two (2) or more SCR 120V 10 A dimmers) as well as dimmer control circuitry. In another embodiment, referring to FIG. 9 if the module 216 is a relay module, then the module 216 may contain single-pole (such as two (2) Single-Pole 20 A 120V relays) or double-pole (such as one (1) Double-Pole 20 A 220V relay) relays as well as relay control circuitry/switches. It is contemplated that the modular power control system (MPCS) 100 may include any mix of different type modules 216. For example, although the MPCS 100 is described herein as using relay and dimmer modules, any type of modules that may be used for power distribution applications (i.e. for architectural, entertainment, etc.) may be used, such as modules that provide power and control of fluorescent ballasts and various other dimming techniques. Also, the modules may be used for power distribution and control to various other types of electronic/electrical equipment. It should be appreciated that the present invention advantageously provides access to all power phases as desired without having to reconfigure the entire system.

Figure 7C:
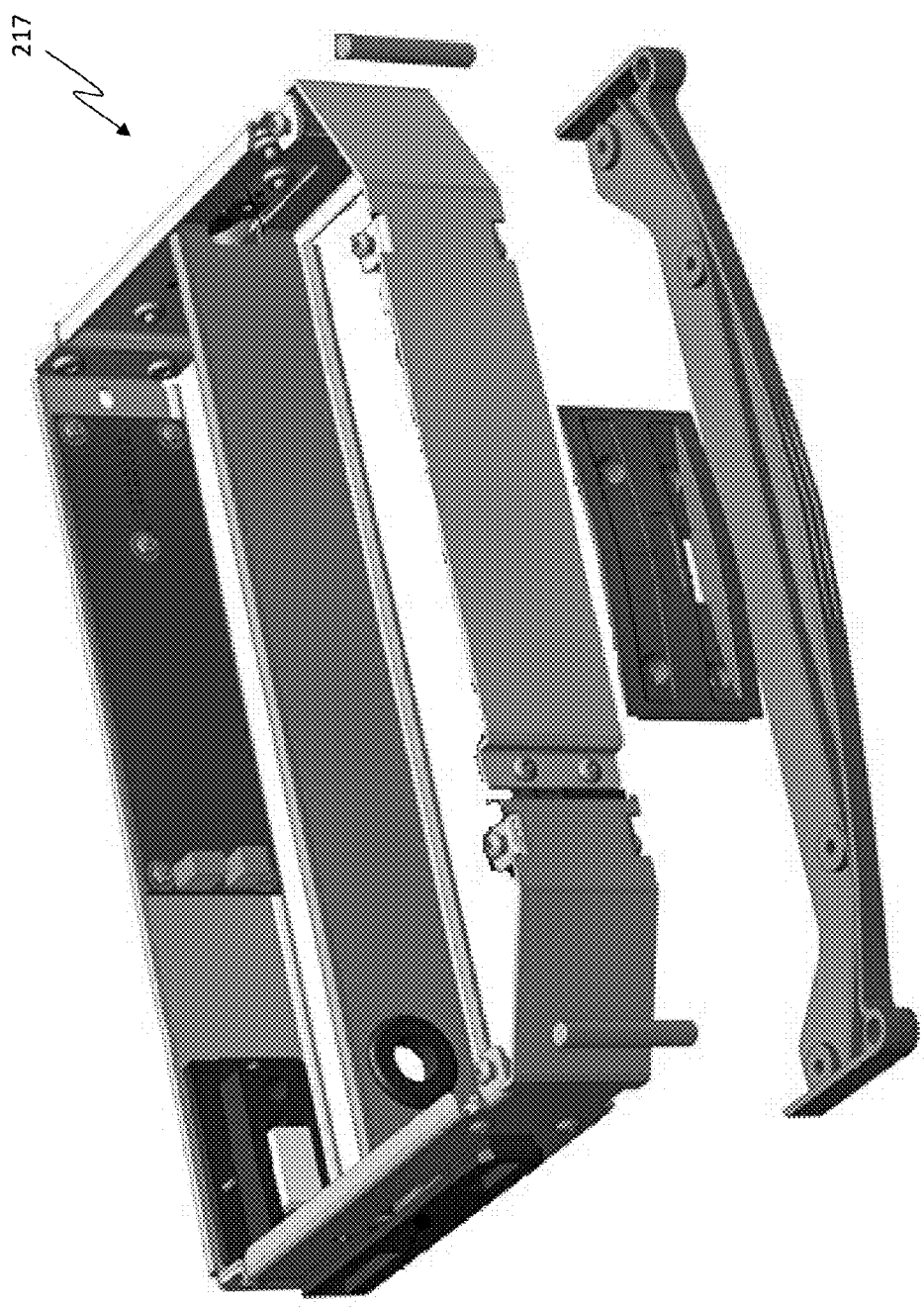
FIG. 7C is top side isometric view of a chimney airflow module for use with the MPCS of FIG. 1.

Additionally, referring to FIG. 7C, it should be appreciated that module 216 may be configured as a chimney airflow module 217, where the module housing cavity 228 is left unpopulated and substantially free of obstruction. The configuration of the chimney airflow module 217 advantageously acts as a flow path guide to direct airflow between the module enclosure bottom 198 and the module enclosure top 196. This is discussed in further detail hereinafter.

Furthermore, the module housing cavity 228 may be divided into a front cavity portion 230 and a rear cavity portion 232. The module housing sides 226 include a side channel guide 234 that is configured (i.e. size and shape) to slidingly and supportingly interact with the module guide channel pair 214, where the side channel guide 234 on one module housing side 226 fits into one of the channels of the module guide channel pair 214 and the side channel guide 234 on the other module housing side 226 fits into the other of the channels of the module guide channel pair 214. It should be appreciated that one (or more) of the side channel guides 234 are sized such that when the side channel guides 234 are contained within the module guide channel pair 214, the resilient member 218 prevents the module 216 from being removed from the module guide channel pair 214. When the resilient member 218 is compressed, the module 216 may be removed from the module guide channel pair 214.

Figure 10:
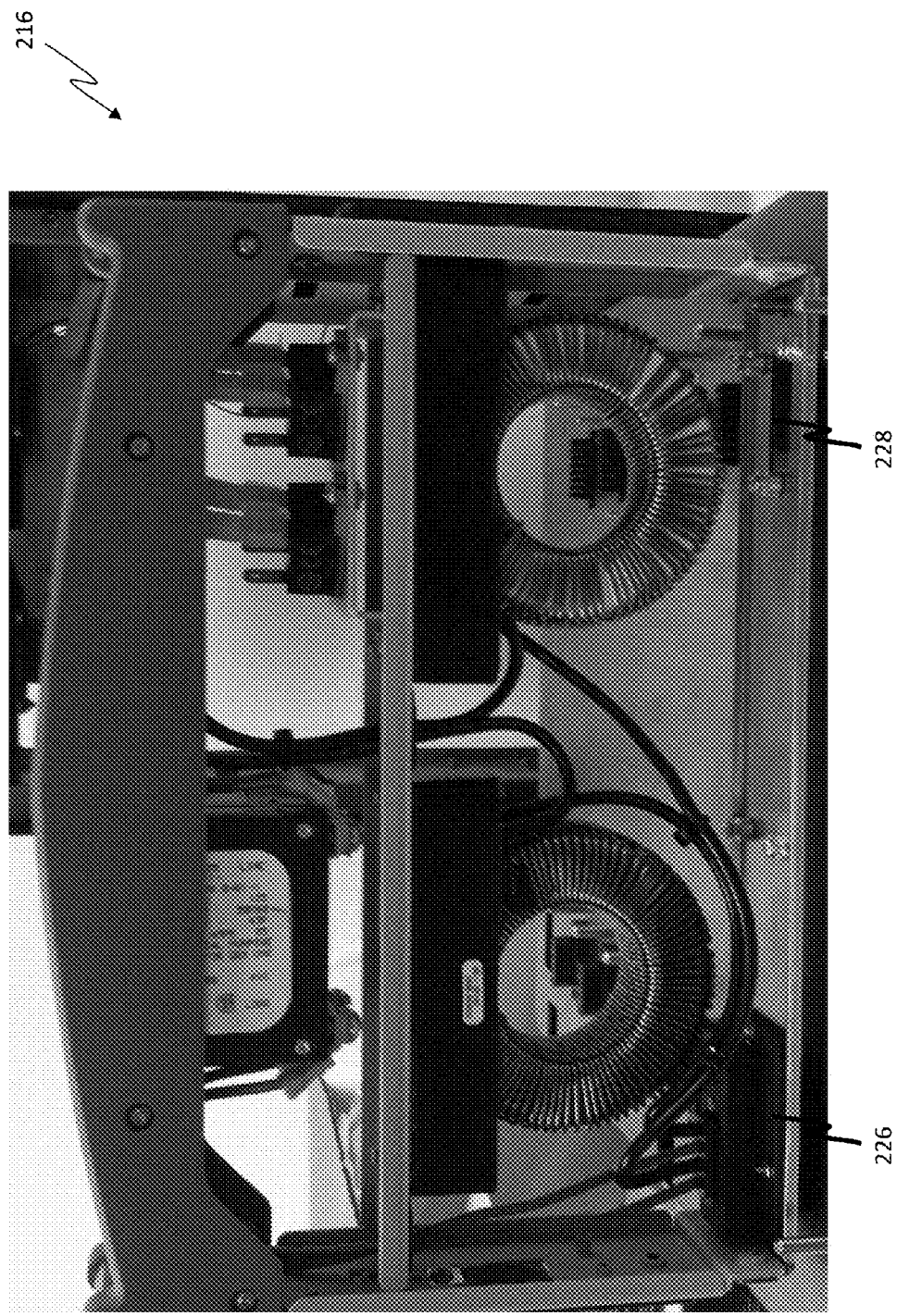
FIG. 10 is bottom up view of one embodiment of a module for use with the MPCS of FIG. 1 illustrating an 'open' design.

Moreover, referring to FIG. 10, the module housing rear 224 includes a module housing power connector 226 for providing input and output phase power to and from the module 216 and a module housing signal connector 228 for providing control signals to and from the module 216. The module housing power connector 226 is configured to mate with a power connector of the plurality of power connectors 166 and the module housing signal connector 228 is configured to mate with a signal connector of the plurality of signal connectors 168. As discussed further hereinafter, in one embodiment there is a power connector 166 and a signal connector 168 for each of the modules 216 and the power connector 166 and signal connector 168 are located on the base enclosure door front 126, such that when the module 216 is located within the module enclosure 106, the power connector 166 is mated to and connected with the module housing power connector 226 and the signal connector 168 is mated to and connected with the module housing signal connector 228.

It should be appreciated one advantage of the present invention involves the physical distribution of the phases (Phase A, Phase B, Phase C) to the power connectors 166 (See FIG. 4A-FIG. 4D) which advantageously allows availability of and access to multiple phases for applications (via the module 216) that use single or multiple phases (for example, single-pole or double-pole devices). Accordingly, while the invention is discussed herein as being used with dimmers and relays, a module of any functionality that incorporates single-pole or double-pole devices can be used with the present invention.

Figure 11:
FIG. 11 is a top side isometric view of the module enclosure front panel of the MPCS of FIG. 1.

Referring to FIG. 11, the module enclosure front panel 110 is shown and includes a module enclosure front panel front 236, a module enclosure front panel rear 238 and a module enclosure front panel opening 240. The module enclosure front panel 110 is configured to securely associate with the module enclosure front 192 such that when modules 216 are located within the module enclosure 106 (i.e. within the module guide channel pairs 214) the module housing front 222 is accessible to allow circuit breaker switches to be turned on and off.

Figure 12:
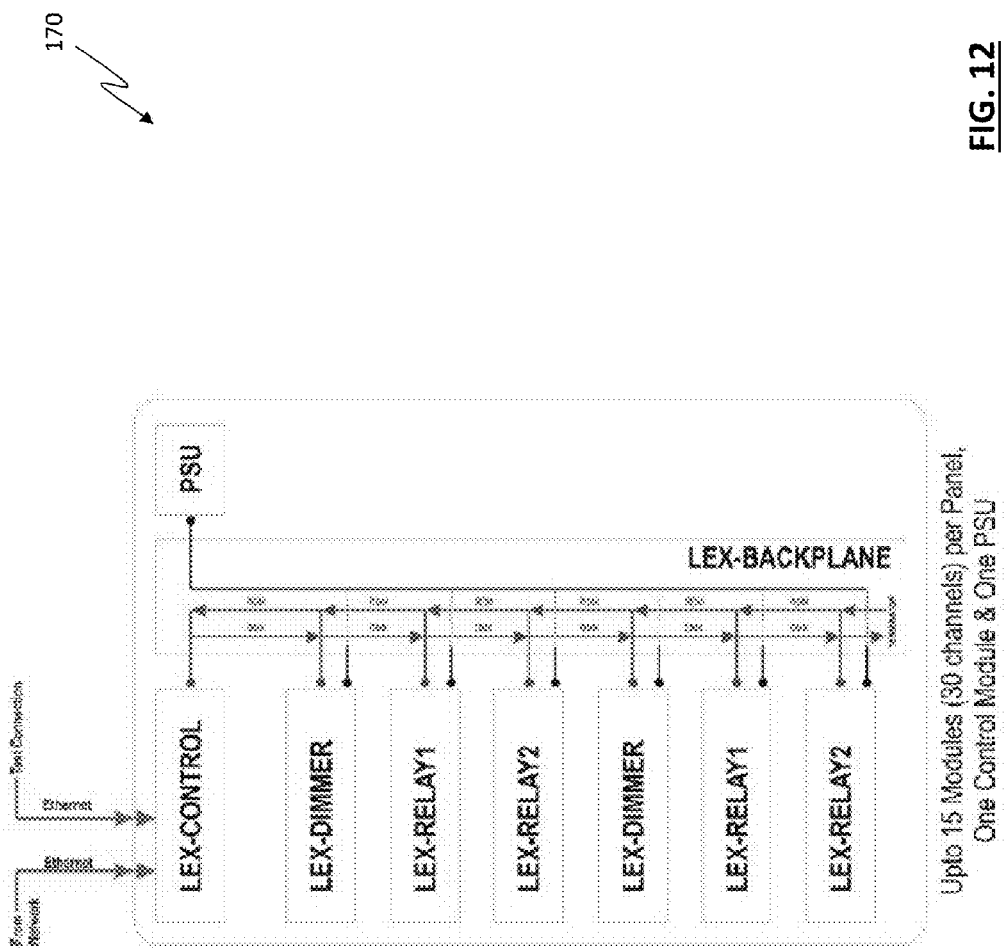
FIG. 12 is block diagram illustrating one embodiment of the PCB Backplane configured for Ethernet capability for use with the MPCS of FIG. 1.
Figure 13:
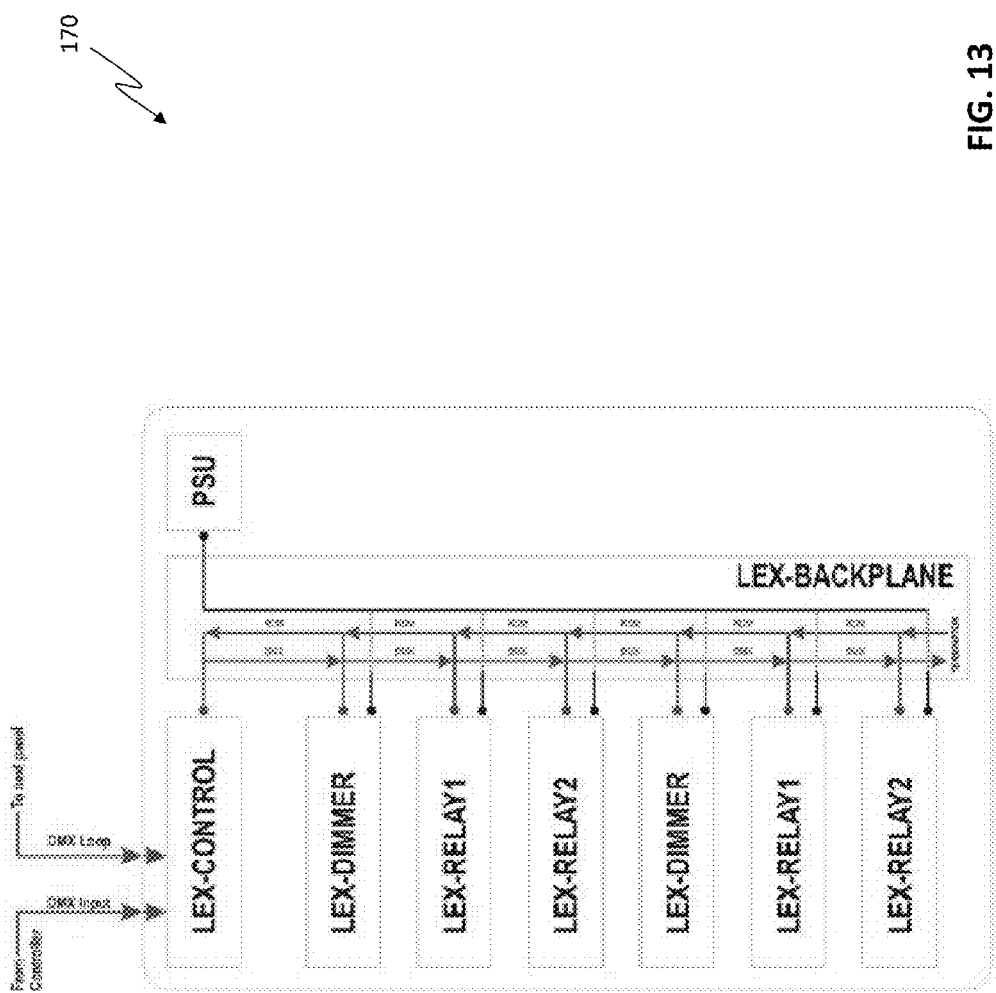
FIG. 13 is block diagram illustrating another embodiment of the PCB Backplane configured for DMX capability for use with the MPCS of FIG. 1.
Figure 14:
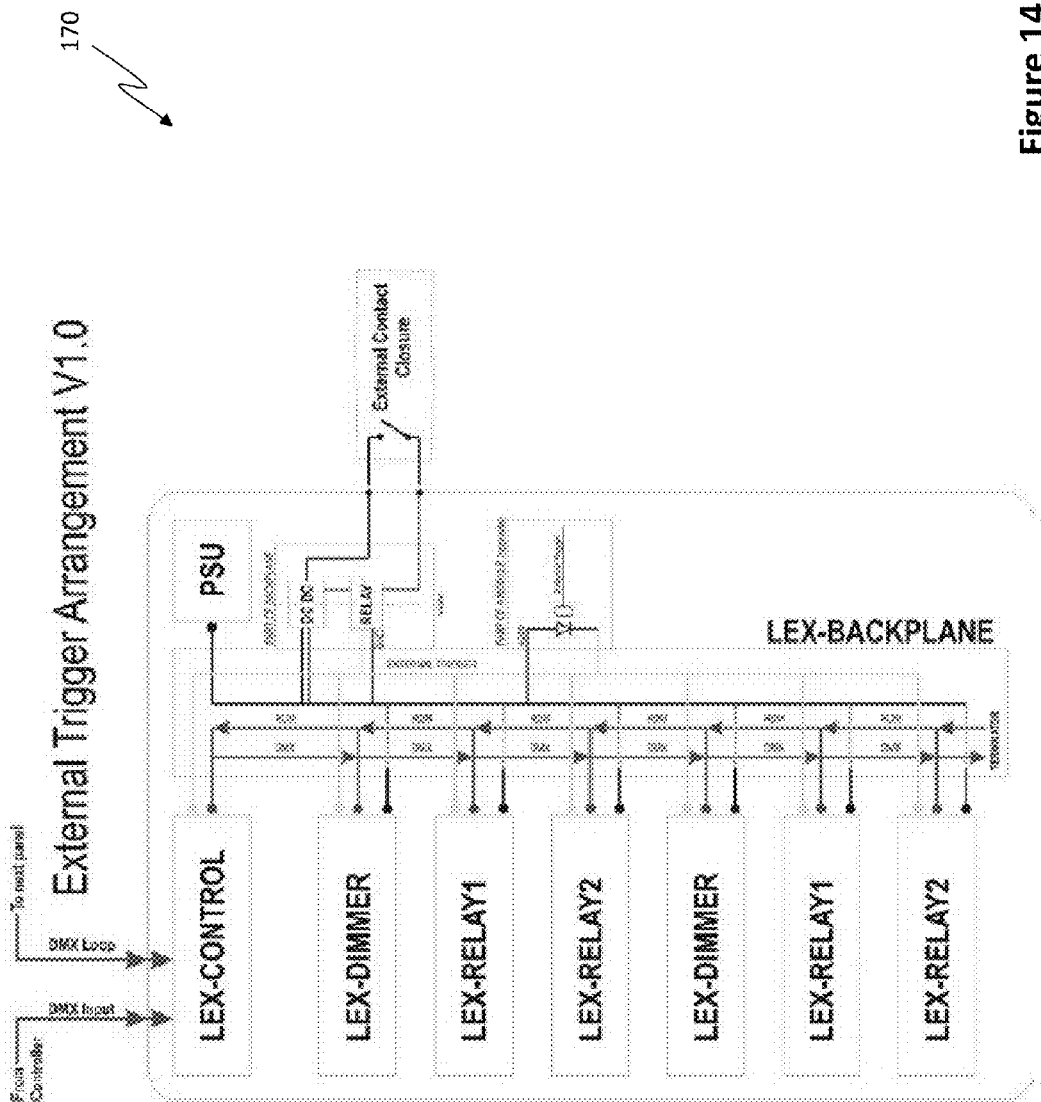
FIG. 14 is block diagram illustrating still yet another embodiment of the PCB Backplane configured for DMX capability for use with the MPCS of FIG. 1.

It should be appreciated that the PCB Backplane 170 may be a modular PCB that includes circuitry to connect the Modules 216 together and to supply power and to provide DMX/RDM and external control trigger capabilities. Referring to FIG. 12, one embodiment of the PCB Backplane 170 which is configured for use with network capability (sACN and ArtNET) is shown. Referring to FIG. 13, another embodiment of the PCB Backplane 170 which is configured for use with DMX/RDM ("daisy chain") capability is shown. Referring to FIG. 14, still yet another embodiment of the PCB Backplane 170 which is configured for use with DMX/RDM and External Trigger Arrangement capability is shown. Additionally, other PCB Backplanes may be used that are configured for use with sACN and ArtNET protocols.

Accordingly, the present invention allows for multiple levels of control. For example, in one configuration control may be accomplished using Streaming ACN or ArtNet and provides a full range of feedback and control abilities, such as providing amperage, temperature and lamp hours and the ability to check the status of any channel in any module in any panel in the system. In another configuration control may be provided using DMX or RDM and may provide the ability to check the status of any channel 'downstream' of the plug-in point. Additionally, all of the modules/devices used in the MPCS 100 may be UL924-compliant devices.

In accordance with one embodiment of the present invention, the MPCS 100 (which may a self support structure or may be mounted to a structure) may be assembled as follows. The base enclosure 102 is obtained and the power supply 152, Power Phase input terminals 154, 156, 158, power output distribution block 160, neutral terminal 164 and ground terminal 162 are secured within the base enclosure cavity 122. This may be accomplished via any method suitable to the desired end purpose such as screws, adhesive, clips, etc. Three-phase power conductors are introduced into the base enclosure cavity 122 via an opening (not shown) where the Phase A conductor is connected to the Phase A input terminal 154, the Phase B conductor is connected to the Phase B input terminal 156 and the Phase C conductor is connected to the Phase C input terminal 158. Additionally, the neutral conductor of the input power is connected to the neutral terminal 164 and the ground conductor of the input power is connected to the ground terminal 162. The power supply may be powered by the input power by connecting the power lead of the power supply to one of the Phase input terminals 154, 156, 158. Additionally, the base enclosure door 104 is obtained and the plurality of power connectors 166 (where the number of power connectors 166 being used is dependent upon the number of modules the system can accommodate) are secured to the base enclosure door 104 such that the mating portion of the power connectors are protruding through the plurality of power connector openings 140 such that the mating portion of the power connectors are accessible via the base enclosure door front 126. The PCB Backplane 170 is connected to the base enclosure door 104 to be located within the base enclosure door cavity 136 such that the plurality of signal connectors 168 are protruding from the plurality of signal connector openings 142.

The base enclosure door 104 is connected to the base enclosure 102 (such that the base enclosure opening 124 is proximate to the base enclosure door opening 138) via a hinge 144 which allows the base enclosure door 104 to rotate between a closed configuration (where the base enclosure door 104 covers and encloses the base enclosure cavity 122) and an open configuration (where the base enclosure door 104 is rotated away from the base enclosure 102). A locking device (not shown) may be provided to secure and/or lock the base enclosure door 104 in the closed configuration to limit and/or prevent access to the base enclosure cavity 122 for safety and/or security purposes. It should be appreciated that the locking device may be any type of locking device suitable to the desired end purpose, such as a lock/catch combination or the locking device may simply be one or more screws that secure the base enclosure door 104 to the base enclosure 102. The power phases at each of the Phase input terminals 154, 156, 158 are then connected to the power input pins of the power connectors 166 to be configured as shown in FIG. 4B, FIG. 4C and FIG. 4D and the output pins of the power connectors 166 are connected to the power output distribution block 160. Moreover, the power from the power supply 152 is connected to the PCB Backplane 170. The base enclosure door 104 is then configured into the closed configuration to enclose and isolate the base enclosure cavity 122 and the base enclosure door cavity 136 from the external environment. This configuration advantageously secures the base enclosure cavity 122 and the base enclosure door cavity 136 from unwanted access but also provides a high degree of safety by preventing unintended contact with high power components.

The module enclosure 106 is securely mounted to the base enclosure door 104 such that that the module enclosure rear opening 204 is adjacent the base enclosure door front 126. Guide pins may be provided on the on the base enclosure door front 126 and guide holes may be provided on the module enclosure rear 194 to help position the module enclosure 106 for mounting. It should be appreciated that the module enclosure rear opening 204 allows access to the plurality of power connectors 166 and plurality of signal connectors 168 via the module enclosure front opening 206. The module enclosure internal support 108 is located within the module enclosure cavity 202 and mounted to the module enclosure sides 200 and/or module enclosure rear 194. The module enclosure 106 may be secured to the base enclosure door 104 and the module enclosure internal support 108 may be secured to the module enclosure 106 via any device or method suitable to the desired end purpose, such as screws, clips, adhesive, etc. It should be appreciated that the design of the module enclosure 106 and module enclosure internal support 108 allow for the module enclosure cavity 202 to be substantially open. It should be further appreciated that one or more airflow fans 242 (powered by the power supply 152) may be mounted (via screw, clip, adhesive, etc.) on the module enclosure bottom 198 under the modules 216 and vent openings 244 may be included on the module enclosure top 196. Additionally, it should be appreciated that the chimney airflow module 217 may be associated with the module enclosure internal support 108 to be located proximate the module enclosure bottom 198.

Figure 15:
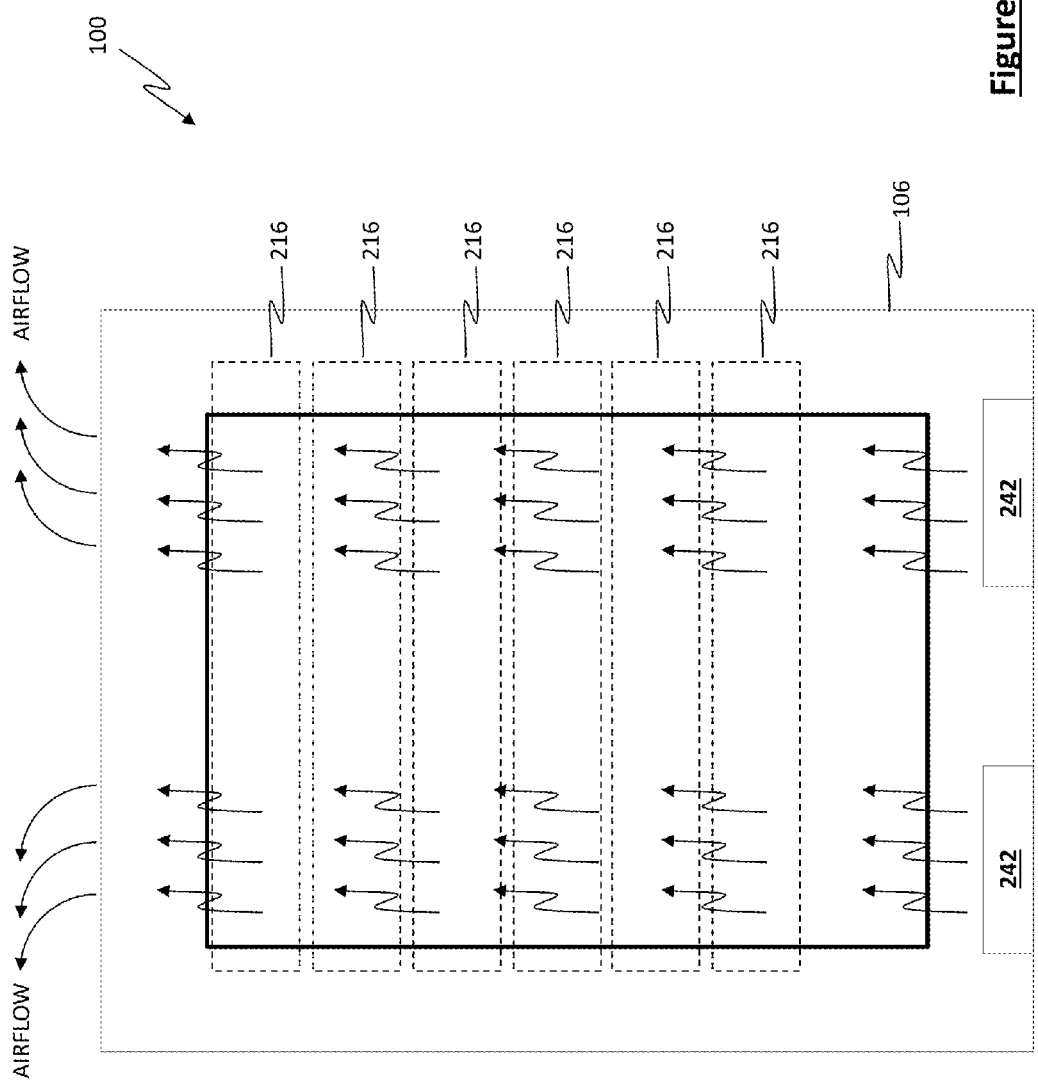
FIG. 15 is front view of the module enclosure of FIG. 1 illustrating airflow within the module enclosure cavity.

Referring to FIG. 15, this configuration advantageously creates and functions as a "heat chimney" within the module enclosure, with the chimney airflow module 217 directing the air flow from the airflow fans 242 upward toward the modules 216 and out of the vent openings 244. Additionally, the modules 216 are configured as an 'open' design (See FIG. 7A) where the top and bottom of the module 216 is open (or includes openings) to accommodate airflow through the module 216 to flow between the top of the module 216 and the bottom of the module 216. This advantageously allows the airflow to contact the components within the module 216 and thus any heat generated from the module component is directed up and out of the module enclosure 106 via the vent openings 244. It should be appreciated that the Modular Power Control System (MPCS) 100 may or may not include (one or more) chimney airflow modules 217 as desired. For example, in a Modular Power Control System (MPCS) 100 which is filled with modules 216 a chimney airflow module 217 may not be used. Moreover, in a Modular Power Control System (MPCS) 100 which is not completely filled with modules 216, the empty module locations may be kept empty as desired.

At this point, one or more modules 216 may be located within the module enclosure 106 by inserting the side channel guides 234 of the module 216 within the module guide channel pairs 214 and sliding the module 216 along the module guide channel 214 toward the back of the module enclosure cavity 202. As the module 216 approaches the back of the module enclosure cavity 202, the module housing power connector 226 and the module housing signal connector 228 contact the power connector 166 and signal connector 168, respectively and mate together such that the power and signal leads from the module housing power connector 226 is connected to the power connector 166 and such that the module housing signal connector 228 is connected to the signal connector 168. This advantageously provides power and signal connection between the module 216 and the base enclosure 102.

Accordingly, when the airflow fans 242 are activated, the air flow path is directed upward toward the vent openings 244. As discussed above the chimney airflow module 217 may be used to further direct the airflow to the modules 216. This advantageously creates and operates as a "heat chimney" directing the airflow over the module component and directing heat from the modules components up and out of the vent openings 244.

In accordance with one embodiment of the present invention, a method for reducing heat within a module enclosure is provided and includes creating and/or receiving an airflow into the enclosure, directing the airflow through the enclosure such that the airflow is at least partially incident on at least one of the heat generating and/or non-heat generating components and directing the airflow out of the enclosure, where the airflow may be created/directed using active methods (i.e. fans) and/or passive methods (guides).

It should be appreciated that the enclosure proportions may be based on airflow and/or Ampacity requirements. This advantageously allows for the enclosures to be reduced in size. For example, FIG. 16 shows one embodiment of different sizes for an MPCS 100 relative to Ampacity with varying number of modules. Additionally, the configuration of the present invention advantageously provides a degree of isolation between the internal components of the MPCS 100 and the external environment, resulting in a safer system and reducing/eliminating the introduction of dust and other debris into the MPCS 100. Furthermore, the fan(s) 242 may be operated on a continuous basis (no on/off noise transitioning) to advantageously allow the MPCS 100 to be used in noise sensitive environments. Moreover, the communication ability of the modules may allow the modules 216 to have the ability to report operational characteristics. For example, the module may be configured to report the temperature and amperage present at each channel. Or the module may be configured to check amperage, temperature or lamp hours of any other module from anywhere in the system. Also, modules may have zero-cross sensing to prevent arcing and extend the life of all the relays, whether they are single, double or dimming.

Additionally, it is contemplated that multiple MPCS's 100 may be connected together to create a larger control array. Furthermore, the design of the MPCS 100 allows modules with single-pole devices and modules with double-pole devices to be used in the same system. Also, the design allows modules to be stacked in numerical order (if desired) and do not require balancing.

It should be appreciated that although the MPCS 100 of the present invention is discussed herein as having six (6) modules, the MPCS 100 of the present invention is preferably configured to accommodate any number of modules (in multiples of three (3)) suitable to the desired end result, such as 3, 6, 9, 12 or 15 modules. This is because the power phases (Phase A, Phase B, Phase C) are distributed across three (3) of the power connectors 166. For example, as discussed herein-above, the first power connector 180 provides a connection to power Phase A and power Phase B, the second power connector 182 provides a connection to power Phase C and power Phase A and the third power connector 184 provides a connection to power Phase B and power Phase C. Accordingly, this configuration advantageously helps to ensure that the loads connected to the power phases are as balanced as possible across all three (3) phases (Phase A, Phase B, Phase C). It should be appreciated that in the above configuration the power phase-connector pattern (A-B, C-A, B-C) may be repeated every third power connector 166. However, it should be appreciated that although the modules are discussed herein as being in groups of three (3, 6, 9, 12, 15, 18, etc. . . . ) for load balancing purposes, any number of modules may be used as desired, such as 4, 5, 7, etc. . . . . In this case, the system would operate, but would be unbalanced and thus less stable.

It should be appreciated that while the invention has been described with reference to an exemplary embodiment, it will be understood by those skilled in the art that various changes, omissions and/or additions may be made and equivalents may be substituted for elements thereof without departing from the spirit and scope of the invention. In addition, many modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

What is claimed is:

1. A modular power control system, comprising:
    a base enclosure having a base enclosure top, a base enclosure bottom, a base enclosure front, a base enclosure rear and two base enclosure sides, wherein the base enclosure defines a base enclosure cavity;
    a base enclosure door having a base enclosure door top, a base enclosure door bottom, a base enclosure door front, a base enclosure door rear and two base enclosure door sides, wherein the base enclosure door defines a base enclosure door cavity;
    a module enclosure having a module enclosure top, a module enclosure bottom, a module enclosure rear and two module enclosure sides, wherein the module enclose defines a module enclosure cavity and includes at least one fan on the module enclosure bottom and at least one vent opening in the module enclosure top;
    a module enclosure internal support, wherein the module enclosure internal support includes a module enclosure internal support rear and two module enclosure internal support sides having a first module guide channel located on one of the two module enclosure internal support sides and a second module guide channel located on the other of the two module enclosure internal support sides; and
    at least one module, wherein the at least one module includes a module rear, a module front and module sides which define a module cavity, wherein each of the module sides include a side channel guide for interacting with the first and second module guide channels to support the module.

2. The modular power control system of claim 1, wherein the at least one module includes a chimney module having a substantially vacant module cavity, the chimney module being associated with the at least one fan to direct air flowing out of the fan through the chimney module cavity toward the at least one vent opening.

3. The modular power control system of claim 1, further comprising a base electrical component located within the base enclosure cavity, wherein the base enclosure door includes a plurality of base power connectors which are in electrical communication with the base electrical component such that each base connector is connected to a plurality of electrical power phases.

4. The modular power control system of claim 3, wherein the module further includes a module electrical component located within the module cavity.

5. The modular power control system of claim 4, wherein the module rear includes a module power connector electrically connected to the module electrical component and configured to mate with at least one of the base power connectors when the module is contained within the module cavity such that the module electrical component is connected to at least one of the plurality of electrical power phases.

6. The modular power control system of claim 3, wherein the plurality of electrical power phases include Phase A power, Phase B power and Phase C power.

7. The modular power control system of claim 6, wherein the plurality of base power connectors include a first base power connector connected to Phase A power and Phase B power, a second base power connector connected to Phase C power and Phase A power and a third base power connector connected to Phase B power and Phase C power.

8. The modular power control system of claim 1, wherein at least one of,
    the module enclosure internal support is contained within the module enclosure cavity and securely associated with and adjacent to the module enclosure rear and module enclosure sides, and
    the base enclosure, base enclosure door, module enclosure and module enclosure internal support are constructed from a metallic material.

9. A modular power control system, comprising:
    a base enclosure;
    a base enclosure door, wherein the base enclosure and base enclosure door define a cavity for containing base electrical components, wherein the base enclosure door includes a plurality of base connectors which are in electrical communication with the base electrical components such that each base connector is connected to a plurality of electrical power phases;
    a module enclosure having a module enclosure top, a module enclosure bottom and two module enclosure sides which include module guide channels, wherein the module enclose defines a module enclosure cavity and includes a fan on the module enclosure bottom and a vent opening in the module enclosure top; and
    a module, wherein the module includes a module rear, a module front and module sides which defines a module cavity having a module electrical component, wherein each of the module sides include a side channel guide for slidingly interacting with the module guide channels to support the module within the module enclosure cavity and wherein the module rear includes a module power connector configured to mate with the base connector when the module is contained within the module cavity such that the module electrical component is connected to at least one of the plurality of electrical power phases.

10. The module power control system of claim 9, further comprising a chimney module having a chimney module rear, a chimney module front and chimney module sides which defines a substantially vacant module cavity, wherein when the chimney module is located within the module enclosure cavity the chimney module is located above the fan such that air flowing from the fan is directed through the chimney module cavity toward the vent opening.

11. The modular power control system of claim 9, wherein the plurality of electrical power phases include Phase A power, Phase B power and Phase C power.

12. The modular power control system of claim 11, wherein the plurality of base power connectors include a first base power connector connected to Phase A power and Phase B power, a second base power connector connected to Phase C power and Phase A power and a third base power connector connected to Phase B power and Phase C power.

13. The modular power control system of claim 9, wherein side channel guides are configured to slidingly interact with the module guide channels to support the module.

14. The modular power control system of claim 9, further comprising a module enclosure internal support, wherein the module enclosure internal support is contained within the module enclosure cavity and securely associated with and adjacent to the module enclosure rear and module enclosure sides.

15. The modular power control system of claim 9, wherein the base enclosure, base enclosure door, module enclosure and module enclosure internal support are constructed from a metallic material.

16. A modular power control system, comprising:
a base enclosure;
a base enclosure door, wherein the base enclosure and base enclosure door define a cavity for containing base electrical components, wherein the base enclosure door includes a plurality of base connectors which are in electrical communication with the base electrical components such that each base connector is connected to a plurality of electrical power phases;
a module enclosure having a module enclosure top, a module enclosure bottom and two module enclosure sides which include module guide channels; and
a module, wherein the module includes a module rear, a module front and module sides which defines a module cavity having a module electrical component, wherein each of the module sides include a side channel guide for slidingly interacting with the module guide channels to support the module within the module enclosure cavity and wherein the module rear includes a module power connector configured to mate with the base connector when the module is contained within the module cavity such that the module electrical component is in electrical communication with at least one of the plurality of electrical power phases.

17. The modular power control system of claim 16, wherein the plurality of electrical power phases include Phase A power, Phase B power and Phase C power.

18. The modular power control system of claim 17, wherein the plurality of base power connectors include a first base power connector connected to Phase A power and Phase B power, a second base power connector connected to Phase C power and Phase A power and a third base power connector connected to Phase B power and Phase C power.

19. The modular power control system of claim 16, further comprising a module enclosure internal support, wherein the module enclosure internal support is contained within the module enclosure cavity and securely associated with and adjacent to the module enclosure rear and module enclosure sides.

20. The modular power control system of claim 19, wherein the base enclosure, base enclosure door, module enclosure and module enclosure internal support are constructed from a metallic material.

* * * * *